(12) United States Patent
Bouche et al.

(10) Patent No.: US 9,691,626 B1
(45) Date of Patent: Jun. 27, 2017

(54) METHOD OF FORMING A PATTERN FOR INTERCONNECTION LINES IN AN INTEGRATED CIRCUIT WHEREIN THE PATTERN INCLUDES GAMMA AND BETA BLOCK MASK PORTIONS

(71) Applicant: GLOBALFOUNDRIES Inc., Grand Cayman (KY)

(72) Inventors: Guillaume Bouche, Albany, NY (US); Jason Eugene Stephens, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/077,384

(22) Filed: Mar. 22, 2016

(51) Int. Cl.
| | |
|---|---|
| *H01L 21/308* | (2006.01) |
| *H01L 21/768* | (2006.01) |
| *H01L 21/311* | (2006.01) |
| *H01L 21/02* | (2006.01) |

(52) U.S. Cl.
CPC ...... *H01L 21/3081* (2013.01); *H01L 21/0217* (2013.01); *H01L 21/02115* (2013.01); *H01L 21/02164* (2013.01); *H01L 21/3088* (2013.01); *H01L 21/31144* (2013.01); *H01L 21/76832* (2013.01)

(58) Field of Classification Search
None
See application file for complete search history.

(56) References Cited

U.S. PATENT DOCUMENTS

| | | |
|---|---|---|
| 6,455,436 B1 | 9/2002 | Ueda et al. |
| 8,298,943 B1 | 10/2012 | Arnold et al. |
| 8,999,848 B2 | 4/2015 | Lee et al. |
| 9,012,287 B2 | 4/2015 | Liaw |
| 9,123,656 B1 | 9/2015 | Hsieh et al. |
| 9,209,279 B1 | 12/2015 | Zhang et al. |
| 9,406,775 B1 | 8/2016 | Bouche et al. |
| 2013/0244344 A1 | 9/2013 | Malmhall et al. |
| 2013/0329486 A1 | 12/2013 | Juengling |

(Continued)

OTHER PUBLICATIONS

U.S. Appl. No. 15/077,480, filed Mar. 22, 2016.
(Continued)

*Primary Examiner* — Michael Jung
(74) *Attorney, Agent, or Firm* — Heslin Rothenberg Farley & Mesiti P.C.

(57) ABSTRACT

A method of forming a pattern includes providing a structure having an etch mask layer disposed over a pattern layer disposed over a dielectric layer. Disposing first and second trench plugs having different material compositions in the etch mask layer, the first and second trench plugs overlaying gamma and beta block mask portions respectively of the pattern layer. Forming an array of self-aligned spacers disposed on sidewalls of mandrels, the spacers and mandrels defining alternating beta and gamma regions extending normally to the dielectric layer, the gamma region and beta regions extending though portions of the first and second trench plug respectively. Selectively etching the structure to remove any portion of the first trench plug within the beta region and any portion of the second trench plug within the gamma region. Selectively etching the structure to form a pattern in the pattern layer including the block mask portions.

18 Claims, 23 Drawing Sheets

(56) References Cited

U.S. PATENT DOCUMENTS

| | | |
|---|---|---|
| 2014/0054534 A1 | 2/2014 | Pellizzer et al. |
| 2014/0170853 A1* | 6/2014 | Shamma ............ H01L 21/02115 438/699 |
| 2014/0258961 A1 | 9/2014 | Ke et al. |
| 2014/0273464 A1 | 9/2014 | Shieh et al. |
| 2015/0072527 A1* | 3/2015 | Ng .................... H01L 21/3086 438/696 |
| 2015/0087149 A1 | 3/2015 | He et al. |
| 2015/0140811 A1 | 5/2015 | Huang et al. |
| 2015/0147882 A1* | 5/2015 | Yao ................... H01L 21/76879 438/675 |
| 2015/0318173 A1 | 11/2015 | Shih et al. |
| 2015/0339422 A1 | 11/2015 | Greco et al. |
| 2016/0049307 A1* | 2/2016 | Chen .................. H01L 21/0337 438/696 |
| 2016/0056075 A1 | 2/2016 | Wei et al. |
| 2016/0056104 A1 | 2/2016 | Bouche et al. |
| 2016/0064248 A1* | 3/2016 | Lee .................. H01L 21/76816 438/637 |
| 2016/0086841 A1* | 3/2016 | Song ..................... H01L 29/165 438/424 |
| 2016/0099178 A1 | 4/2016 | Zhana et al. |
| 2016/0254191 A1 | 9/2016 | Tseng et al. |

OTHER PUBLICATIONS

U.S. Appl. No. 15/077,564, filed Mar. 22, 2016.
U.S. Appl. No. 15/271,475, filed Sep. 21, 2016.
U.S. Appl. No. 15/271,497, filed Sep. 21, 2016.
U.S. Appl. No. 15/271,519, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/053,818, filed Feb. 25, 2016.

* cited by examiner

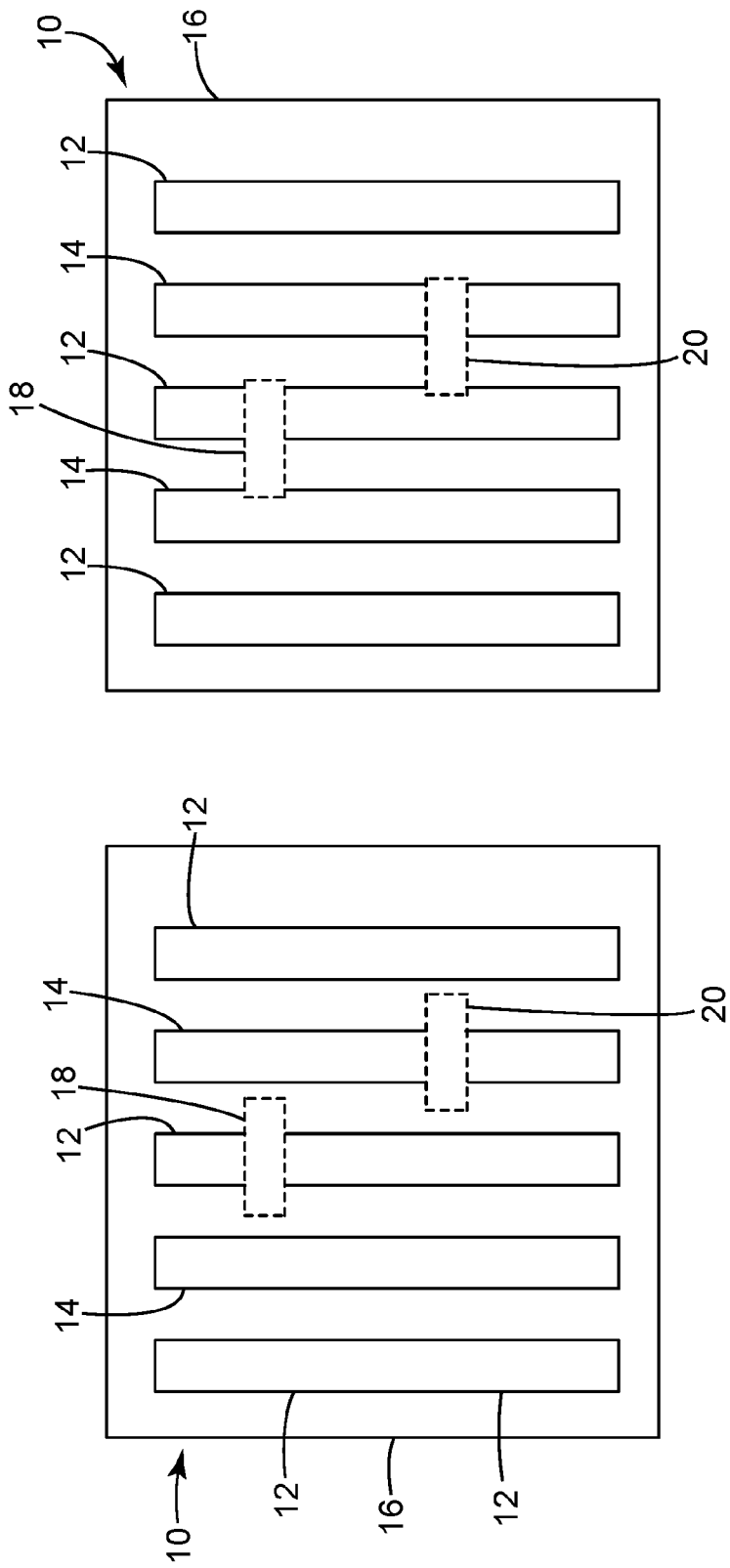

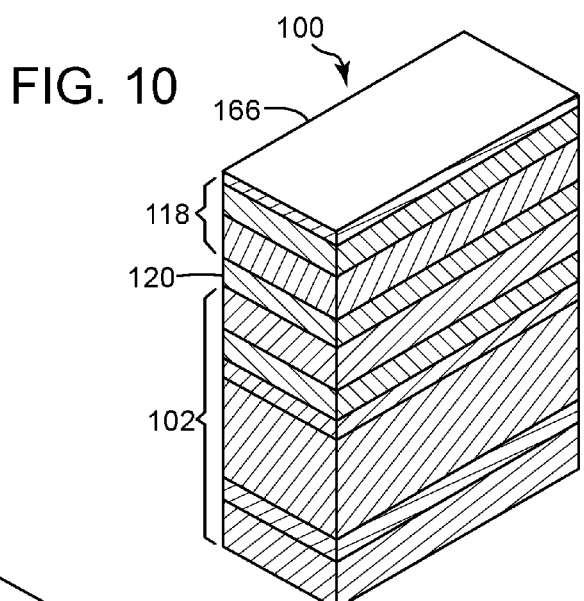
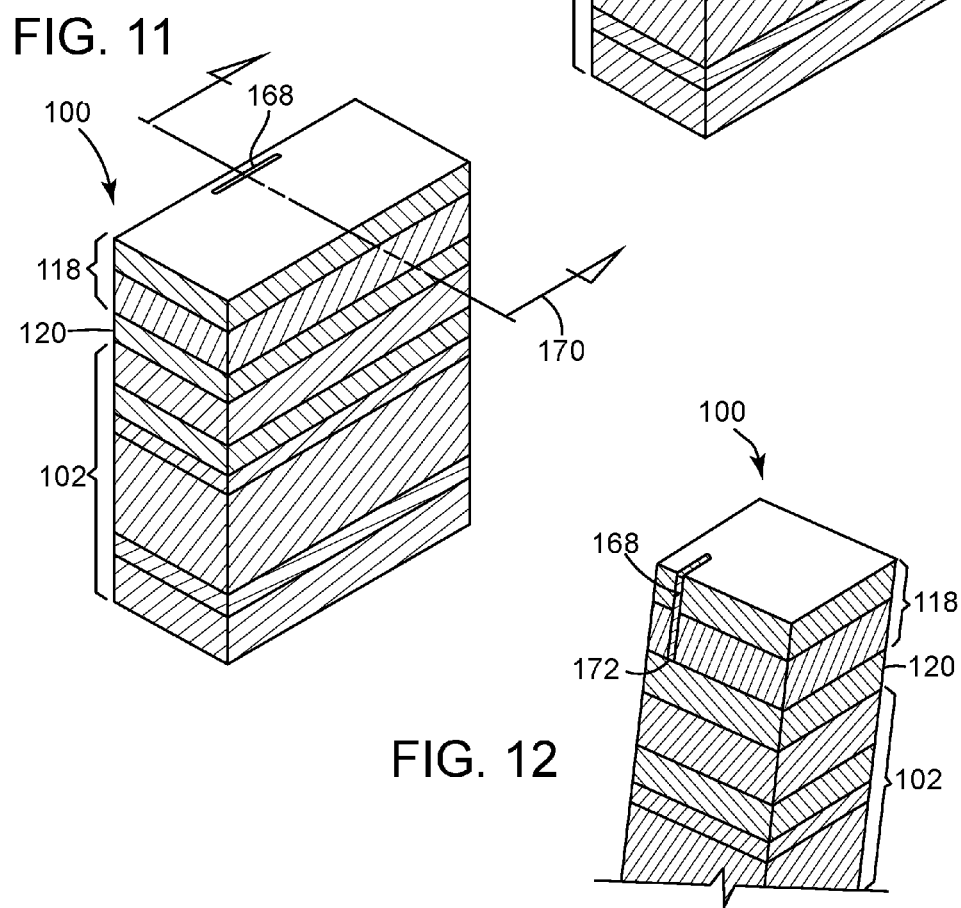
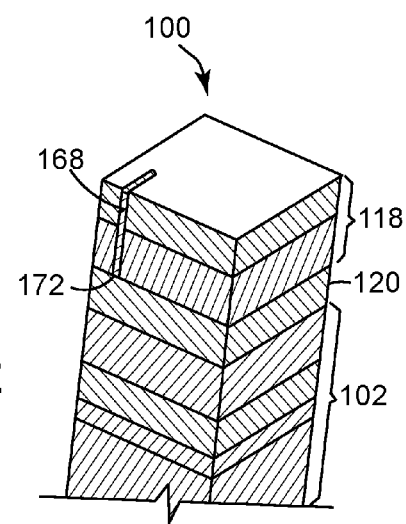

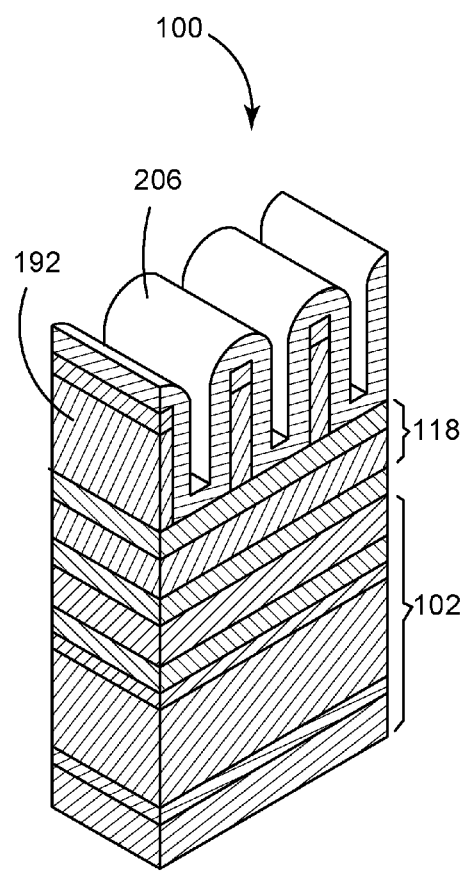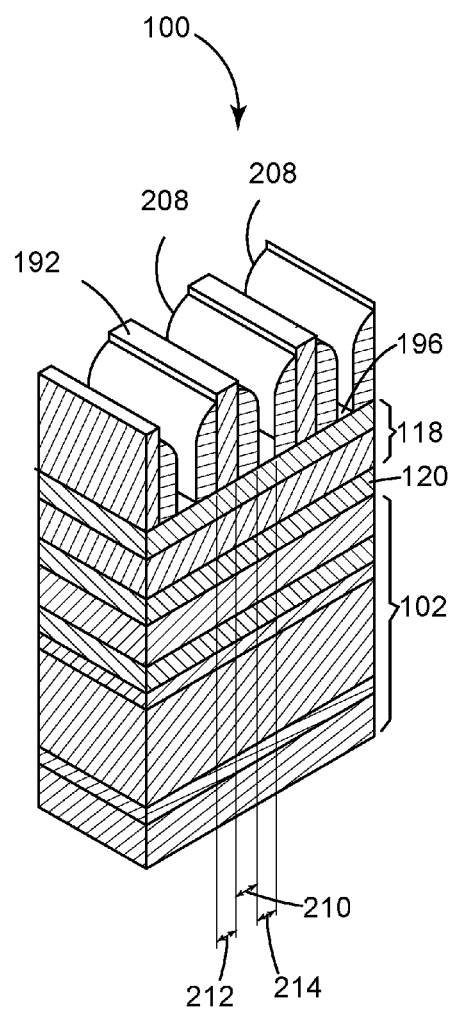

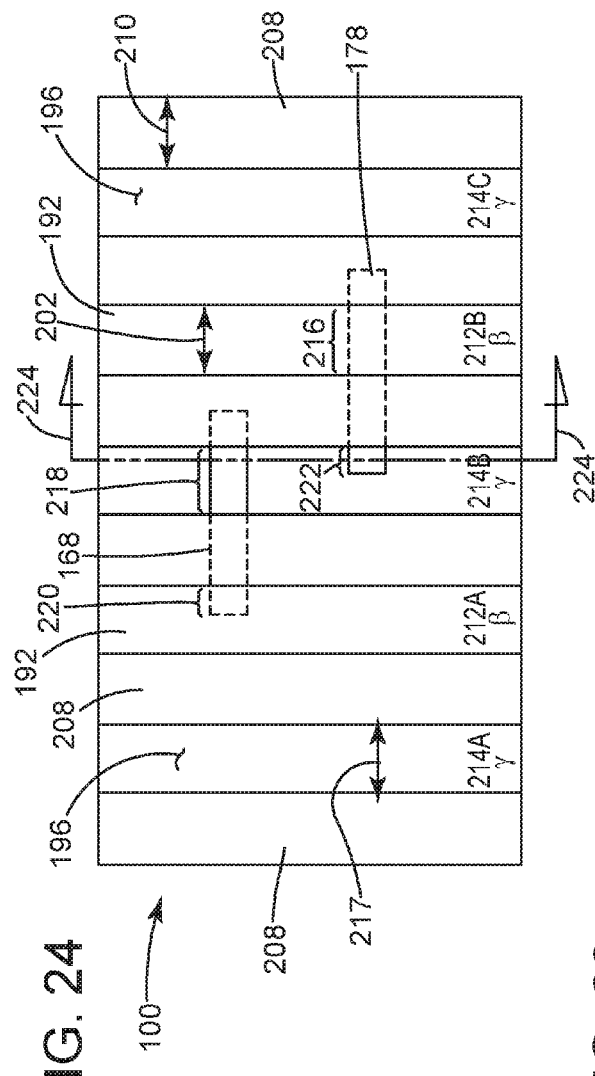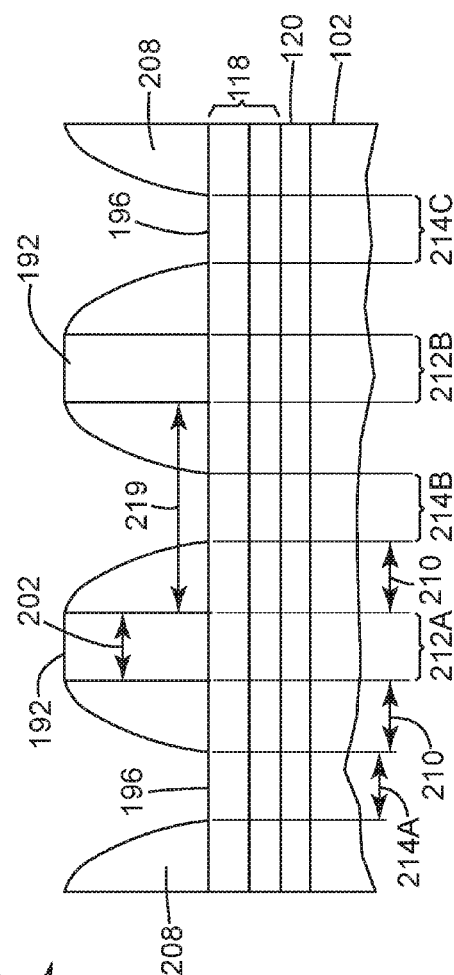

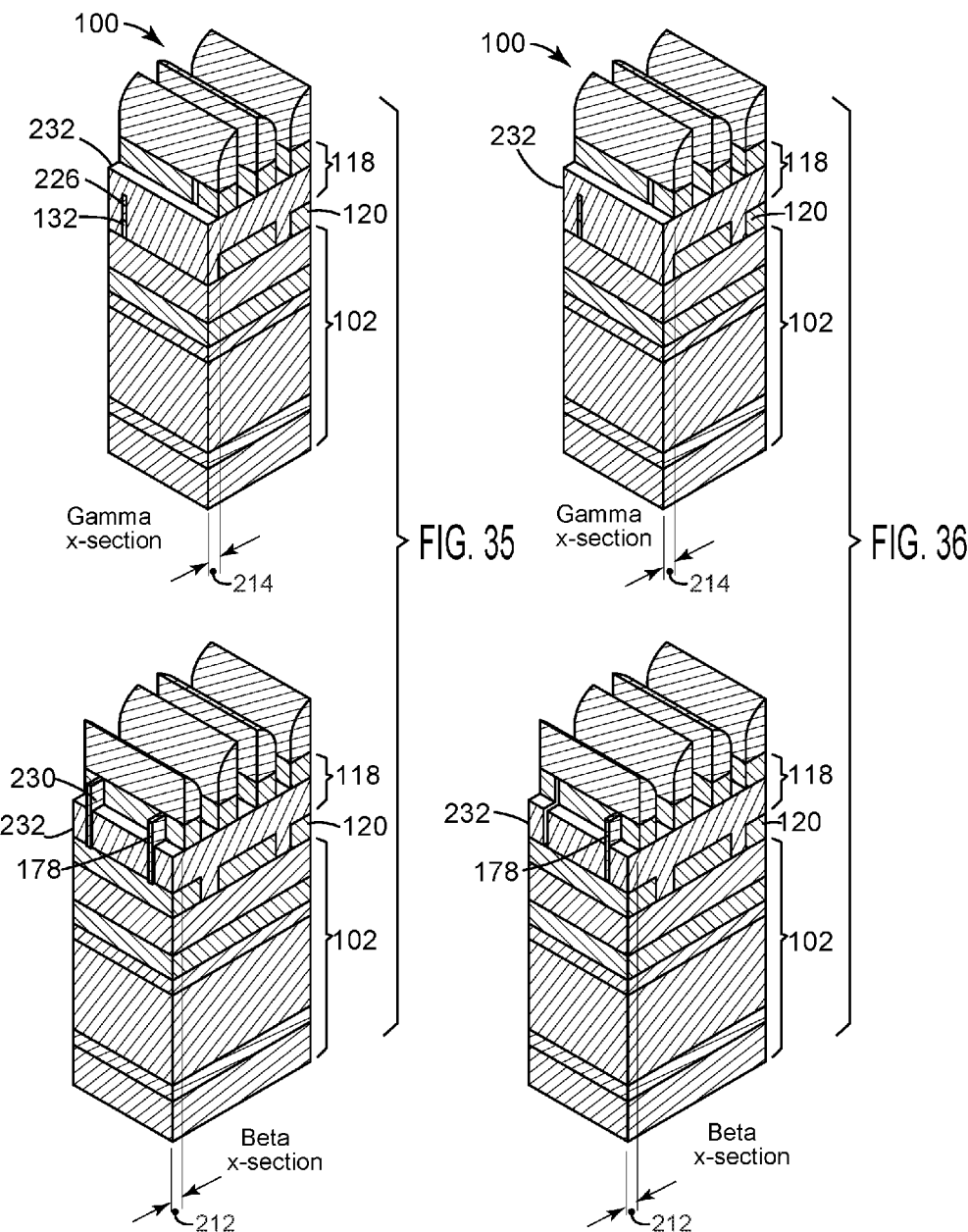

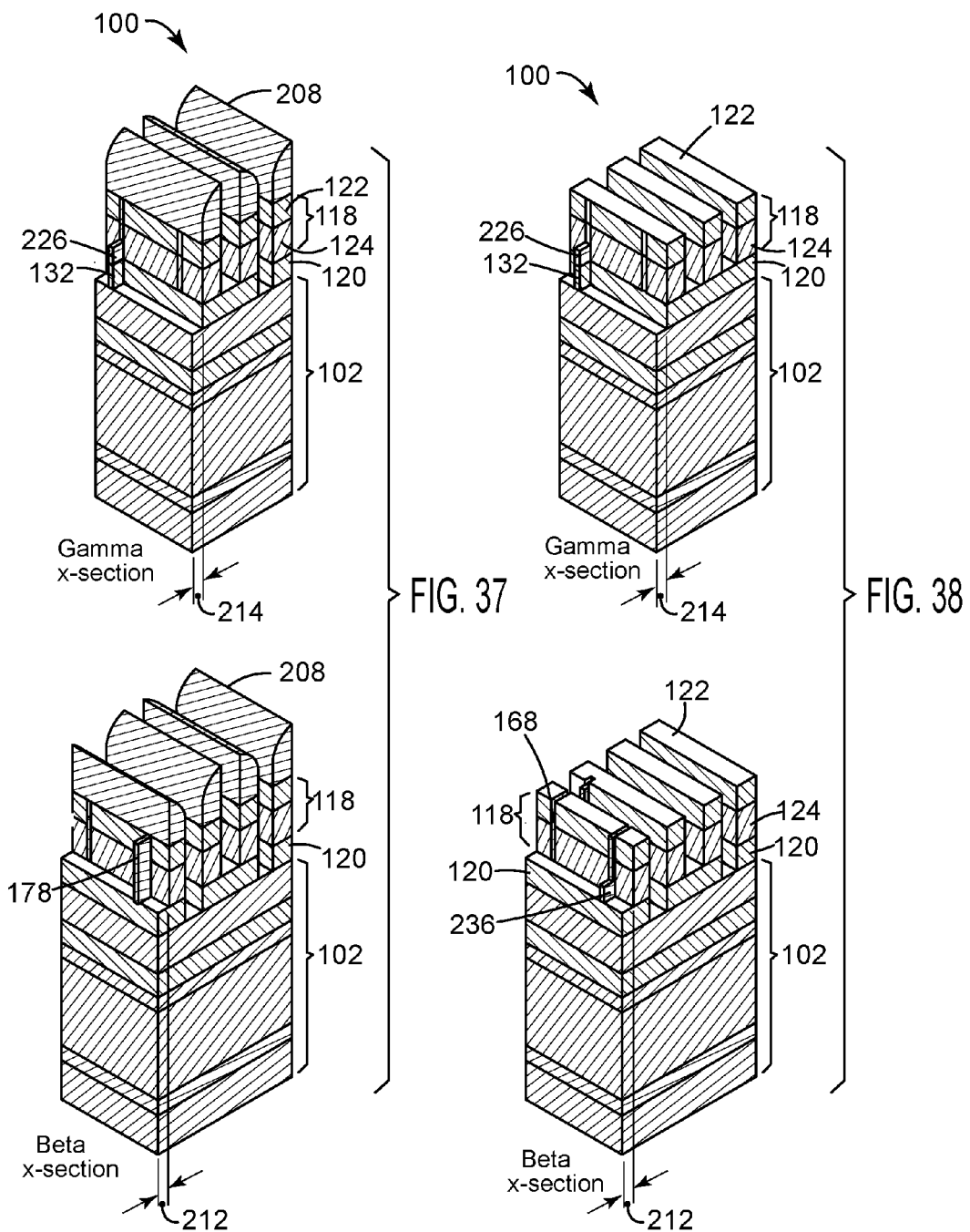

METHOD OF FORMING A PATTERN FOR INTERCONNECTION LINES IN AN INTEGRATED CIRCUIT WHEREIN THE PATTERN INCLUDES GAMMA AND BETA BLOCK MASK PORTIONS

TECHNICAL FIELD

The present invention relates to semiconductor devices and methods of fabricating the same. More specifically, the invention relates to various methods of forming patterns for electrical interconnection systems in integrated circuits.

BACKGROUND

With constant down-scaling and increasingly demanding requirements to the speed and functionality of ultra-high density integrated circuits, semiconductor devices, such as transistors, diodes, capacitors and the like, need ever more complex and densely packaged electrical interconnection systems between devices. The conventional process of manufacturing such interconnection systems has been to use a series of lithographic processes to pattern and dispose metal interconnection lines and vias on a dielectric layer to form a metallization layer. The metallization layer would be disposed above a substrate having active semiconductor devices embedded therein and the interconnection system would provide the contacts and interconnections between those devices.

Previously, the lithography process was carried out on a two-dimensional (2D) scale, that is, on a single metallization layer, wherein geometrically complex patterns were disposed on one level to form the interconnections between devices. However, at about a pitch of 90 nanometers (nm), the resolution of current lithographic processes becomes blurred enough to make such complex patterning unreliable. This is especially the case in the first two metallization layers (M1 and M2) where metallization is the densest.

Therefore, as illustrated in exemplary prior art FIG. 1, at lower technology class sizes, such as the 10 nm class and lower, self-aligned double patterning (SAPD) processes are now used to provide an interconnection system 10 which includes multiple levels of arrays of parallel pairs of straight metallized trenches (or interconnect lines) 12 and 14 disposed in dielectric layers 16. The array of interconnect lines 12 and 14 of each dielectric layer 16 are oriented at 90 degree angles relative to the arrays of the adjacent dielectric layers (not shown). The multiple dielectric layers are connected with a system of vias, such that, once the trenches and vias are metallized, there is electrical continuity between levels of the interconnection system 10.

In order to provide device functionality, a plurality of non-self-aligned dielectric blocks 18 and 20, which block the electric continuity of neighboring interconnection lines 12 and 14, are patterned into the dielectric layer at specific locations to direct current flow between the dielectric layers 16 and devices. The blocks 18 and 20 are patterned into the dielectric layer 16 through a series of lithographic processes. In the exemplary ideal case, as shown in FIG. 1, the lithographic processes are perfectly aligned such that block 18 interrupts the precise active interconnect line 12 it is associated with, without extending into any neighboring interconnect line 14. Additionally block 20 interrupts its interconnect line 14 without extending into any neighboring line 12.

Problematically, lithographic misalignment, or overlay, is a significant issue at lower technology node sizes, such as when the technology class size is no greater than 10 nm or when the repetitive pitch distance is no greater than 40 nm. Overlay is a measure of how well two lithographic layers (or steps) align. Overlay can be in the X or Y direction and is expressed in units of length.

In mass production, the lithographically disposed dielectric blocks 18 and 20 must be large enough to make sure that they always cut the active line they are supposed to (i.e., lines 12 and 14 respectively), taking into account the overlay control for the worst 3 sigma case. In an exemplary worst 3 sigma case scenario, as shown in prior art FIG. 2, for at least the 10 nm class or less, the current state of the art 3 sigma overlay control is not precise enough to prevent dielectric blocks 18 and 20 from over-extending into active neighboring lines in an acceptably few number of cases. That is, the failure rate of blocks 18 extending into adjacent lines 14 and blocks 20 extending into adjacent lines 12 will be outside of the industry acceptable 3 sigma standard.

The unwanted over-extension of blocks 18 (which are supposed to cut lines 12 only) into neighboring lines 14, and over-extension of blocks 20 (associated with lines 14) into neighboring lines 12 can, in the worst case condition, completely interrupt electrical continuity in the wrong line. Additionally, a line that is inadvertently only partially cut may still conduct for a time, but will over heat and prematurely fail.

Accordingly, there is a need for a method of patterning interconnection lines that is tolerant of lithographic misalignment or overlay. Additionally, there is a need for a method that is capable of repairing (i.e., removing) the over-extended portions of dielectric blocks associated with an electrical line that are undesirably disposed upon a neighboring electrical line due to lithographic misalignment.

BRIEF DESCRIPTION

The present invention offers advantages and alternatives over the prior art by providing a method of forming a pattern for interconnection lines of an integrated circuit, wherein the pattern has block mask portions which define electrical continuity blocks within the lines. The method enables the repair of block mask portions which, due to lithographic misalignment limitations, extend into interconnection lines not intended to be blocked.

The method includes providing a structure of an integrated circuit, the structure having an etch mask layer disposed over a pattern layer and the pattern layer disposed over a dielectric layer. Utilizing lithographic processes to dispose first and second trench plugs in the etch mask layer, the trench plugs having different material compositions, the first and second trench plugs overlaying gamma and beta block mask portions respectively of the pattern layer. Utilizing a self-aligned double patterning process to form an array of self-aligned spacers disposed on sidewalls of mandrels, the spacers and mandrels defining alternating beta and gamma regions extending normally through the dielectric layer. The gamma region extending through a portion of the first trench plug and the beta region extending through a portion of the second trench plug. Selectively etching the structure to remove any portion of the first trench plug within the beta region and any portion of the second trench plug within the gamma region. Selectively etching the structure to form a pattern in the pattern layer, the pattern including the block mask portions.

In some embodiments of the invention, the utilization of the lithographic processes includes patterning the etch mask layer to form a first trench and a second trench within the etch mask layer. The first trench overlaying a gamma block mask portion of the pattern layer and the second trench overlaying a beta block mask portion of the pattern layer. Disposing a first trench plug in the first trench and a second trench plug in the second trench, the first and second trench plugs having different material compositions.

In other embodiments of the invention, the utilization of the self-aligned double patterning process includes disposing a lithographic stack of layers over the etch mask layer. Patterning the lithographic stack to form an array of mandrels having sidewalls extending normally upwards from an etch mask surface of the etch mask layer, the mandrels having a mandrel width and a mandrel height. Conformal coating the mandrels and etch mask surface with a thin film. Anisotropically etching the film to expose a portion of the etch mask surface and to form an array of self-aligned spacers disposed on the sidewalls of the mandrels, the spacers having a spacer width and spacer height less than the mandrel height.

In another aspect of the invention, the mandrels define a beta region having a width equal to the mandrel width and extending normally through the dielectric layer. The beta region also extending through a portion of the second trench plug and the beta block mask portion. The exposed portion of the etch mask surface, absent any spacers and mandrels, defines a gamma region having a width equal to the distance between the mandrels minus twice the spacer width. The gamma region extending normally through the dielectric layer, the gamma region also extending through a portion of the first trench plug and the gamma block mask portion.

In an alternative embodiment of the invention, the pattern defines locations of gamma interconnect lines disposed in the gamma region of the dielectric layer and beta interconnect lines disposed in the beta region of the dielectric layer. The gamma block mask portion of the pattern defines locations of gamma blocks in the dielectric layer, which block electrical continuity of gamma interconnect lines. The gamma blocks extending across the entire width of the gamma region but not extending into the beta region. The beta block mask portion of the pattern defines location of beta blocks in the dielectric layer, which block electrical continuity of beta interconnect lines. The beta blocks extending across the entire width of the beta region but not extending into the gamma region.

In another aspect of the invention the method includes disposing a pattern layer over a dielectric layer and disposing an etch mask layer over the pattern layer. Patterning the etch mask layer to form a first trench and a second trench within the etch mask layer, the first trench overlaying a gamma block mask portion of the pattern layer and the second trench overlaying a beta block mask portion of the pattern layer. Disposing a first trench plug in the first trench and a second trench plug in the second trench, the first and second trench plugs having different material compositions. Selectively etching the etch mask layer, first trench plug, second trench plug and pattern layer to form a pattern in the pattern layer, the pattern including the gamma and beta block mask portions. The pattern defining locations of interconnect lines disposed in the dielectric layer and the block mask portions defining locations of continuity blocks in the dielectric layer.

DRAWINGS

The invention will be more fully understood from the following detailed description taken in conjunction with the accompanying drawings, in which:

FIG. 1 is an exemplary embodiment of an ideal case prior art interconnection system with aligned dielectric blocks;

FIG. 2 is an exemplary embodiment of a worst case prior art interconnection system with misaligned dielectric blocks;

FIG. 10 is an exemplary embodiment of the structure of FIG. 9 having a thin film disposed on the etch mask layer in accordance with the present invention;

FIG. 11 is an exemplary embodiment of the structure of FIG. 10 having a first trench plug disposed in the etch mask layer in accordance with the present invention;

FIG. 12 is cross-sectional view of the structure of FIG. 11 taken along the line 170 of FIG. 11 in accordance with the present invention;

FIG. 21 is an exemplary embodiment of the structure of FIG. 20 having a conformal coating disposed thereon in accordance with the present invention;

FIG. 22 is an exemplary embodiment of the structure of FIG. 21 after an anisotropic etching process to form an array of self-aligned spacers disposed on sidewalls of mandrels over the etch mask layer in accordance with the present invention;

FIG. 23 is a close-up side view of FIG. 22 in accordance with the present invention;

FIG. 24 is a close-up top view of FIG. 22 in accordance with the present invention:

Figure 5:
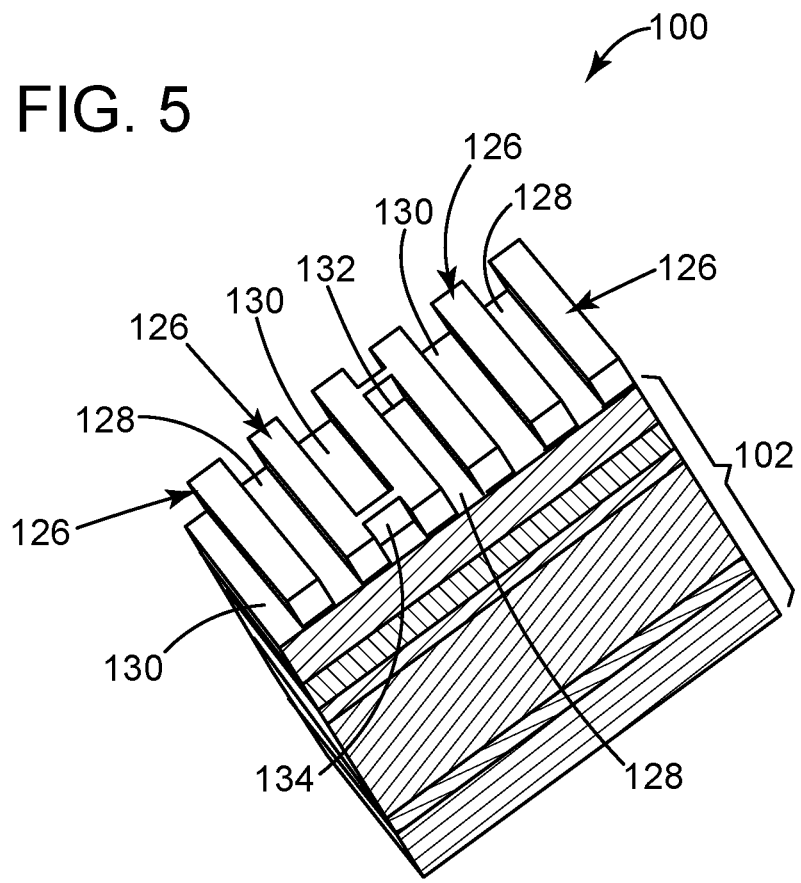
FIG. 5 is an exemplary embodiment of a pattern for an interconnection system in accordance with the present invention.
Figure 34:
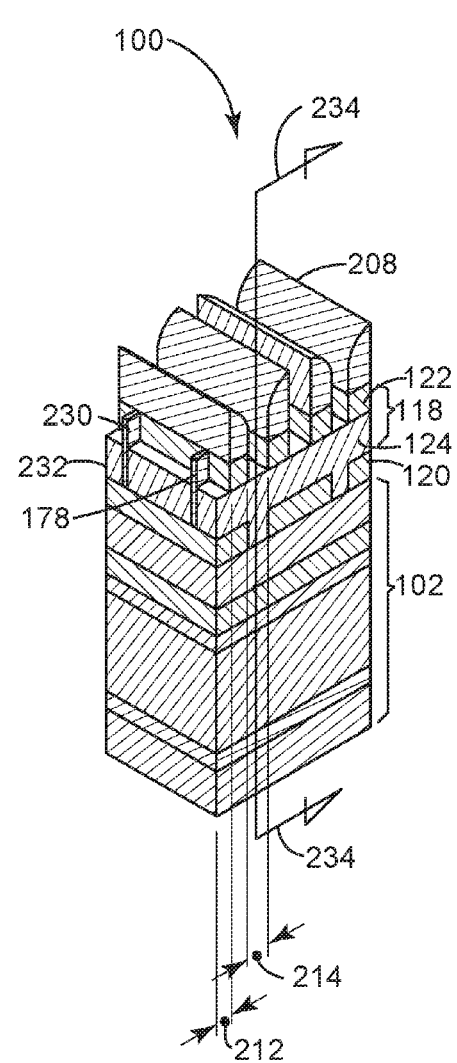
FIG. 34 is an exemplary embodiment of the structure of FIG. 33 after an anisotropic etch process is performed thereon in accordance with the present invention.
Figure 39:
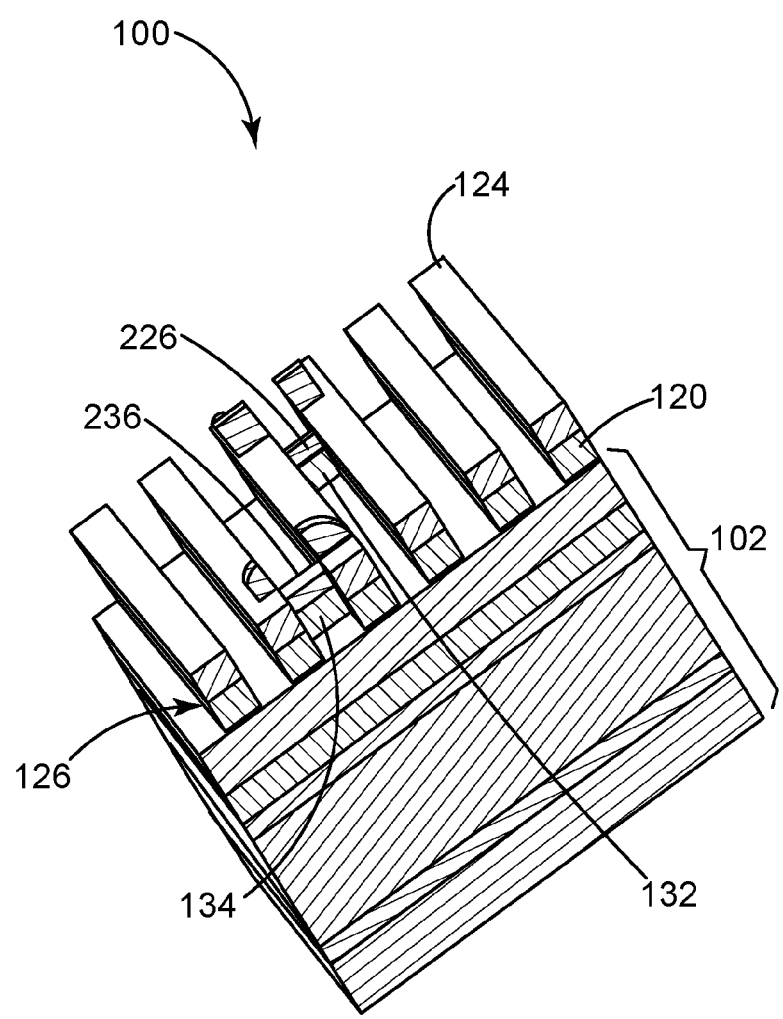

FIG. 35 presents beta and gamma perspective cross-sectional views of FIG. 34 in accordance with the present invention;

FIG. 36 present beta and gamma perspective cross-sectional views of FIG. 35 after an anisotropic etch process is performed thereon in accordance with the present invention;

FIG. 37 presents beta and gamma perspective cross-sectional views of FIG. 36 after an anisotropic etch process is performed thereon in accordance with the present invention;

FIG. 38 presents beta and gamma perspective cross-sectional views of FIG. 37 after an anisotropic etch process is performed thereon in accordance with the present invention; and FIG. 39 is a perspective view of the structure of FIG. 38 after an anisotropic etch process is performed thereon to form the pattern of FIG. 5 in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 3-39 illustrate various exemplary embodiments of methods of forming patterns for interconnection lines for integrated circuits in accordance with the present invention.

Figure 3:
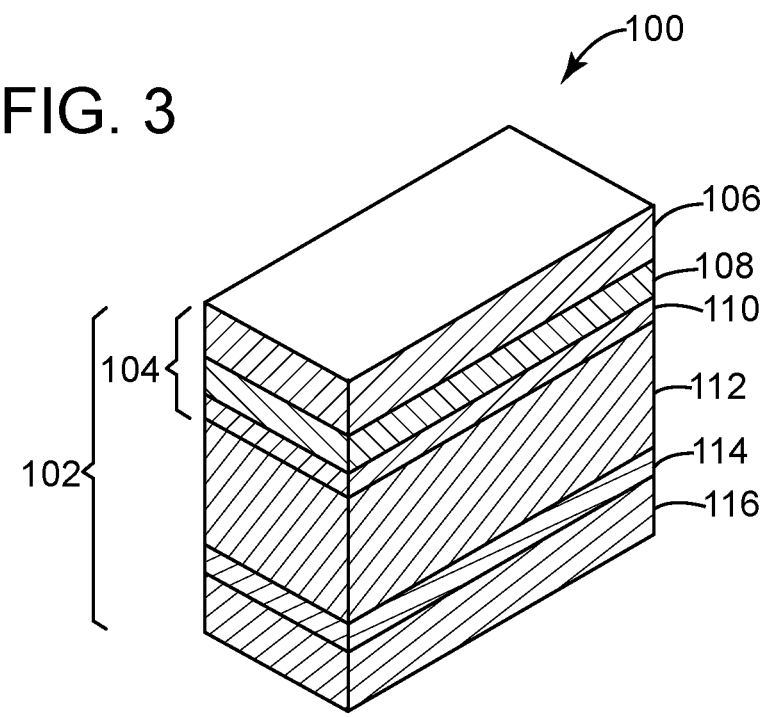
FIG. 3 is simplified view of an exemplary embodiment of a structure for an integrated circuit device having a dielectric layer in accordance with the present invention.

Referring to FIG. 3, a simplified view of an exemplary embodiment of a structure 100 for an integrated circuit device in accordance with the present invention is presented at an intermediate stage of manufacturing. Structure 100 includes a dielectric layer 102. The dielectric layer 102 may include many different combinations of stacks of layers depending on such factors as application requirements, cost, design preferences and the like. For example, the dielectric layer 102 may include a tri-layer stack 104. The tri-layer stack 104 could include a first silicon oxynitride dielectric layer (first SiON dielectric layer) 106 disposed on a first titanium nitride layer (first TiN layer) 108, which is in turn disposed over a second SiON dielectric layer 110.

The tri-layer 104 may be disposed over a low dielectric constant (k) layer 112, such as a dielectric layer composed of various combinations of silicon, carbon, oxygen and hydrogen (an SiCOH layer). The low k layer 112 can be disposed over an etch-stop layer 114, such as a silicon nitride (SiNi) layer. The etch stop layer may be disposed over a complex stack of buried layers 116 from the substrate (not shown) upwards.

Figure 4:
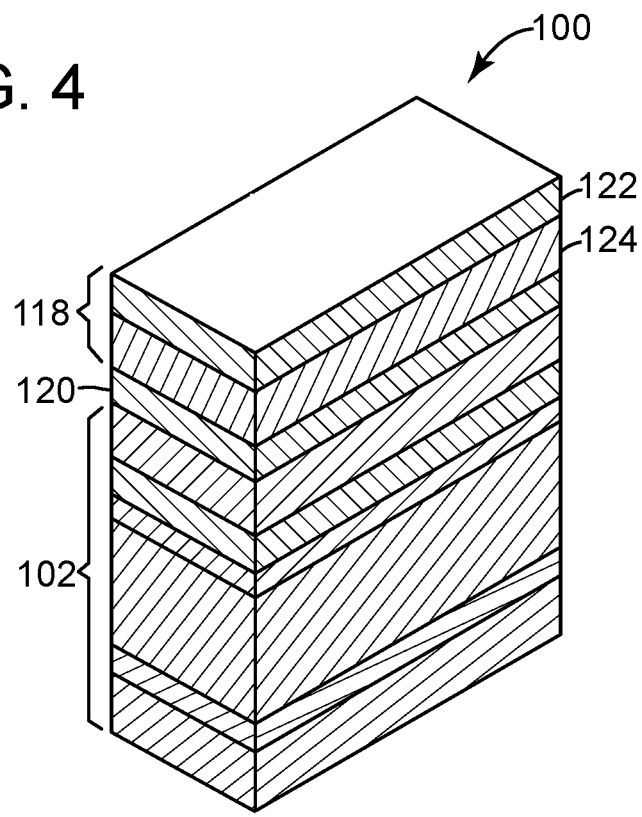
FIG. 4 is an exemplary embodiment of the structure of FIG. 3 having an etch mask layer and a pattern layer disposed on the dielectric layer in accordance with the present invention.

Referring to FIG. 4, an etch mask layer 118 is next disposed over a pattern layer 120, which is, in turn, disposed over the dielectric layer 102 of structure 100. The etch mask layer 118 may be a double layer composed of a memorization (or memo) layer 122 disposed over an interposer layer 124. In this exemplary embodiment, the memo layer 122 and pattern layer 120 are composed of titanium nitride (TiN). The interposer layer 124 is a spin-on hardmask (SOH) layer composed of an amorphous carbon or of any appropriate organic/resist type of material.

The function of the interposer layer 124 is to isolate the memo layer 122 from the pattern layer 120 such that distinct geometric features can be formed into the separated layers 122, 120 in a series of processes. The features can ultimately be processed to be combined into the pattern layer 120 to form a pattern 126, as best illustrated in FIG. 5.

Referring to FIG. 5, as will be discussed in greater detail herein, the pattern 126 defines at least a portion of an electrical interconnection system of structure 100. More specifically, pattern 126 defines locations of gamma interconnect lines 128 disposed in a gamma region of the dielectric layer 102. Additionally, the pattern 126 defines locations of beta interconnect lines 130 disposed in a beta region of the dielectric layer 102. The pattern 126 includes certain gamma block mask portions 132, that define locations of gamma blocks in the dielectric layer 102, which block electrical continuity of the gamma interconnect lines. The gamma blocks extend across the entire width of the gamma region but do not extend into the beta region where they can cut a beta interconnect line. The pattern also includes beta block mask portions 134, that define locations of beta blocks in the dielectric layer 102, which block electrical continuity of beta interconnect lines. The beta blocks extend across the entire width of the beta region but do not extend into the gamma region where they can cut a gamma interconnect line.

Figure 6:
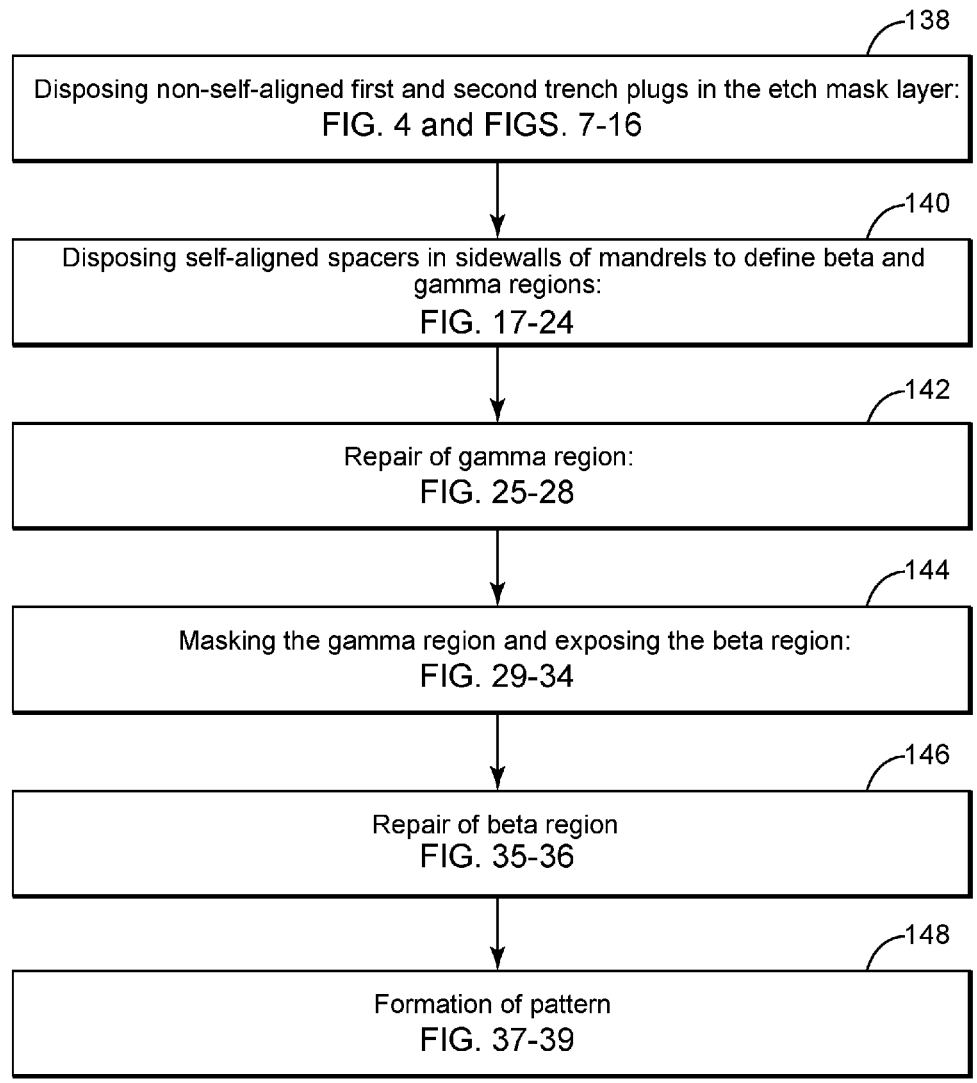
FIG. 6 is an exemplary embodiment of a high level overview of a method utilized to form the pattern of FIG. 5 in accordance with the present invention.

Referring to FIG. 6, an exemplary embodiment of a high level overview of a method utilized to form pattern 126 in accordance with the present invention is illustrated in module flow diagram 136. Module flow diagram 136 includes six separate modules, 138, 140, 142, 144, 146 and 148, wherein each module includes several method steps which will be detailed herein. Briefly the modules may be described as follows:

Module 138: Disposing Non-Self-Aligned First and Second Trench Plugs in the Etch Mask Layer.

Module 138 begins with the steps illustrated in FIG. 4, wherein the etch mask layer 118 (which includes the memo layer 122 and interposer layer 124) is disposed over the pattern layer 120 and the pattern layer is disposed over the dielectric layer 102. Module 138 further includes steps illustrated in FIGS. 7-16 for utilizing lithographic processes to dispose first and second trench plugs in the etch mask layer 118. The trench plugs have different material compositions. The first and second trench plugs overlay gamma and beta block mask portions respectively of the pattern layer 120.

Module 140: Disposing Self-Aligned Spacers on Sidewalls of Mandrels to Define Beta and Gamma Regions.

Module 140 includes steps illustrated in FIGS. 17-24 for utilizing a self-aligned double patterning (SAPD) process to form an array of self-aligned spacers disposed on sidewalls of mandrels. The spacers and mandrels define alternating beta and gamma regions, which extend normally through the dielectric layer 102. The gamma region extends through a portion of the first trench plug and underlying gamma block mask portion of the pattern layer 120. The beta region extends through a portion of the second trench plug and underlying beta mask portion of the pattern layer 120.

Module 142: Repair of Gamma Region.

Module 142 includes steps illustrated in FIGS. 25-28 for removing (repairing) any portion of the second trench plug from the gamma region. Additionally, Module 142 includes steps for selectively etching the first trench plug to form a recessed first trench plug portion in the gamma region.

Module 144: Masking the Gamma Region and Exposing the Beta Region.

Module 144 includes steps illustrated in FIGS. 29-34 for masking the gamma region, including the recessed first trench plug portion in the gamma region. Module 144 also includes steps to expose the beta region for selective etching.

Module 146: Repair of Beta Region.

Module 146 includes steps illustrated in FIGS. 35-36 for removing (repairing) the unrecessed first trench plug portion from the beta region, while preserving the recessed first trench plug portion in the gamma region.

Module 148 Formation of Pattern.

Module 148 includes steps illustrated in FIGS. 37-39 for selectively etching the remaining portions of the etch mask layer 118, first trench plug, second trench plug, and pattern layer 120 to form the pattern 126 in the pattern layer 120.

Module 138: Disposing Non-Self-Aligned First and Second Trench Plugs in the Etch Mask Layer. (FIG. 4 and FIGS. 7-16)

Figure 7:
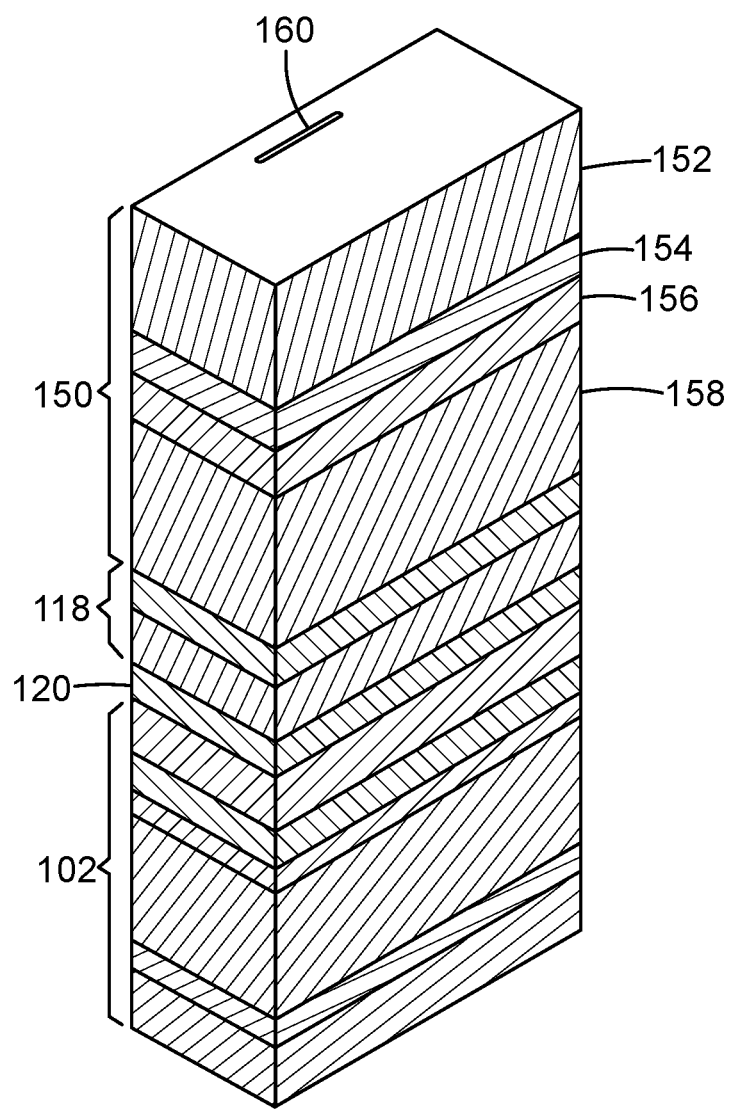
FIG. 7 is an exemplary embodiment of the structure of FIG. 4 having a lithographic stack disposed thereon in accordance with the present invention.

Referring to FIG. 7, once the etch mask layer 118 and pattern layer 120 have been disposed over the dielectric layer 102 (best seen in FIG. 4), the next step in module 138 is to dispose a lithographic stack 150 onto the etch mask layer 118. The lithographic stack 150 can be composed of several different kinds of layers, depending on such parameters as the application requirements, design or proprietary preferences or the like. One such stack of layers includes a stack of four thin films which includes (from top to bottom) a resist layer 152, a bottom antireflective coating (BARC) layer 154, a third SiON dielectric layer 156 and a second SOH layer 158. Once the stack 150 is disposed over the etch mask layer 118, a first cut 160 is patterned through the resist layer 152 of the lithographic stack 150 through well-known lithographic techniques.

Figure 8:
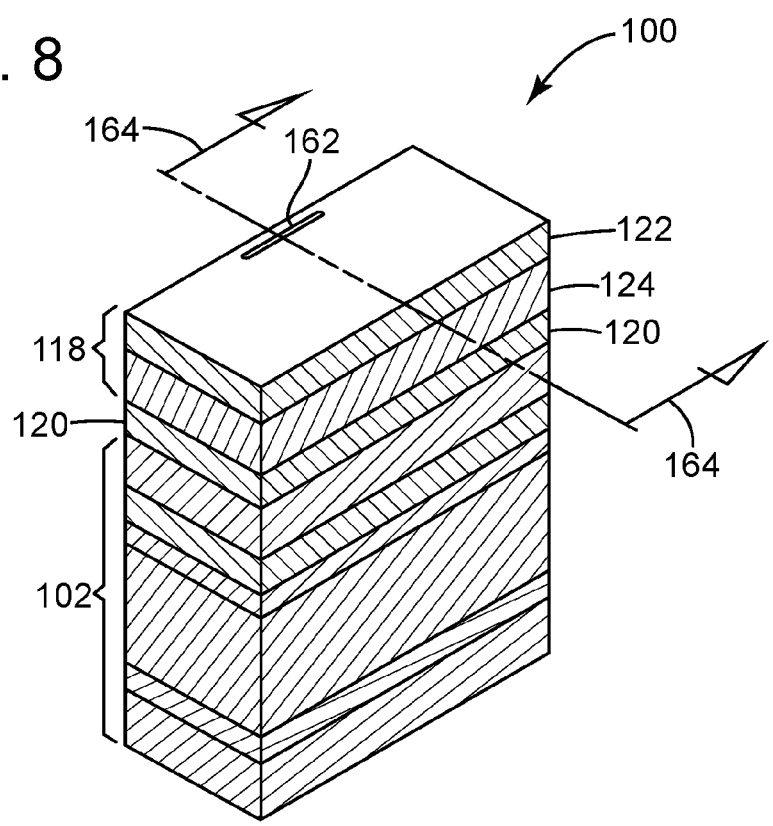
FIG. 8 is an exemplary embodiment of the structure of FIG. 7 after a lithographic process and having a first trench disposed in the etch mask layer in accordance with the present invention.
Figure 9:
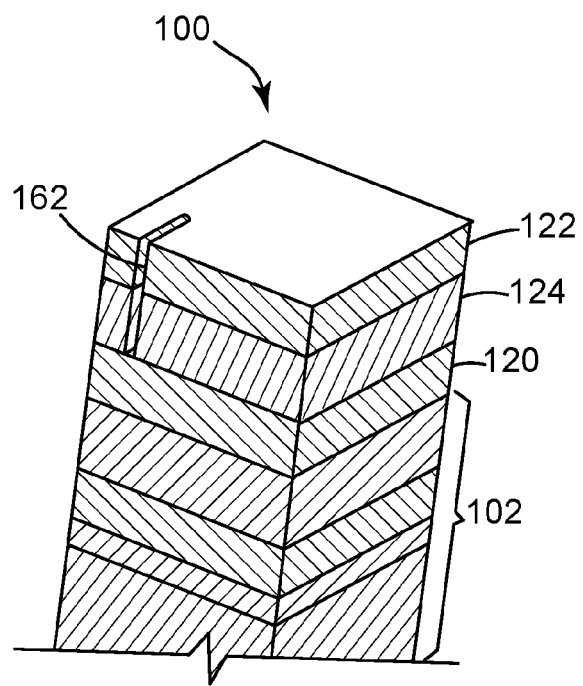
FIG. 9 is a cross-sectional view of the structure of FIG. 8 taken along the line 164 of FIG. 8 in accordance with the present invention.

Referring to FIG. 8, once the lithographic process is complete and the cut 160 is notched into the resist layer 152, an anisotropic etch, such as a reactive ion etch (RIE) process, is used to form a first trench 162 within the etch mask layer 118 and not within the pattern layer 120 (best seen in FIG. 9). Additionally this RIE process, combined with subsequent wet clean processes, is utilized to remove the lithographic stack.

Referring to FIG. 9, a cross-sectional view of FIG. 8 taken along the line 164 is shown. Through well-known RIE techniques, the first trench 162 penetrates into the etch mask layer 118 only. In the exemplary case where the pattern layer 120 is a TiN layer and the etch mask layer 118 is composed of a TiN memo layer 122 and an SOH interposer layer 124, the composition of the reactive plasma of the RIE process is changed as it penetrates from the memo layer 122 to the interposer layer 124 and stops at the pattern layer 120.

Referring to FIG. 10, once the first trench 162 is formed, a silicon nitride (SiN) film 166, or similar, is disposed over the etch mask layer 118 and fills the first trench 162 to form a first trench plug 168 (best seen in FIG. 12). The film 166 can be disposed onto the etch mask layer 118 through an atomic layer deposition (ALD) process or any one of several other well-known deposition techniques.

Referring to FIG. 11, the film 166 is etched back to expose the first trench plug 168. Referring to FIG. 12, a cross-sectional view of FIG. 11 taken along the line 170 is shown. As can be seen, the first trench plug penetrates the etch mask layer 118 and overlays a predetermined portion of the pattern layer 120 referred to herein as the gamma block mask portion 172 of the pattern layer 120.

Figure 13:
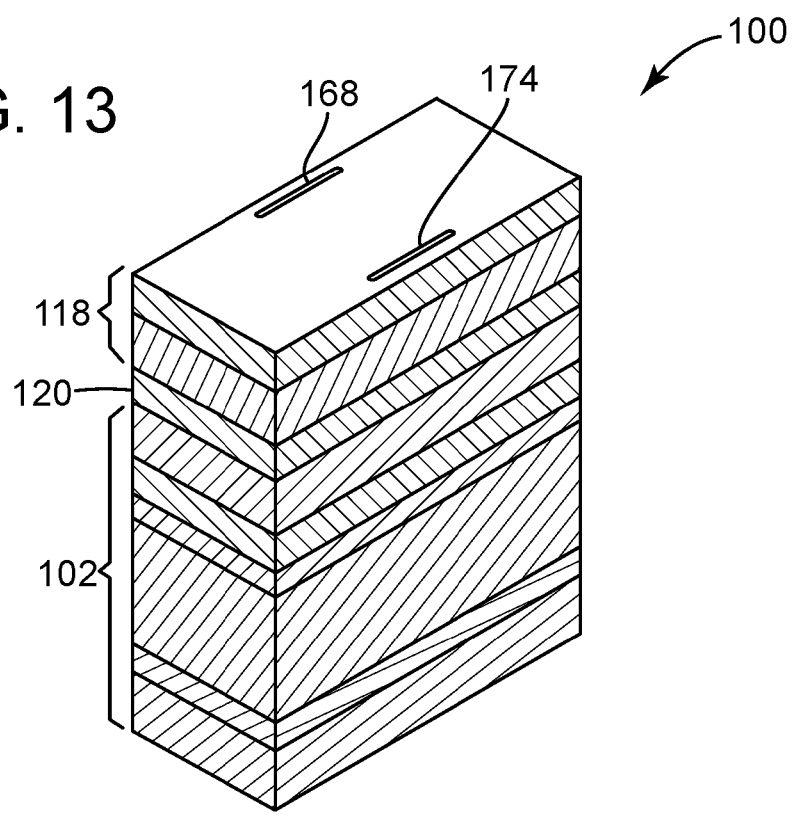
FIG. 13 is an exemplary embodiment of the structure of FIG. 12 having a second trench disposed in the etch mask layer in accordance with the present invention.
Figure 14:
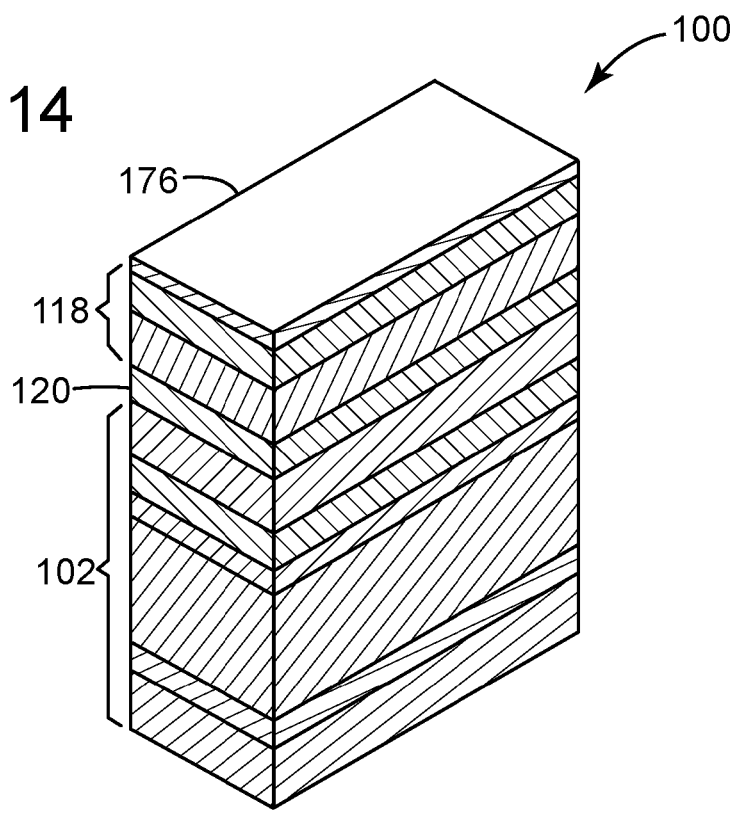
FIG. 14 is an exemplary embodiment of the structure of FIG. 13 having a thin film disposed thereon in accordance with the present invention.

Referring to FIG. 13, a second lithographic process is then used to pattern a second trench 174 in the etch mask layer 118. Then, referring to FIG. 14, a silicon oxide (SiO2) film 176, or similar, is disposed over the etch mask layer 118 to fill the second trench 174 and form a second trench plug 178 (best seen in FIG. 16). The film 176 can also be disposed onto the etch mask layer 118 through an ALD process or similar.

Figure 15:
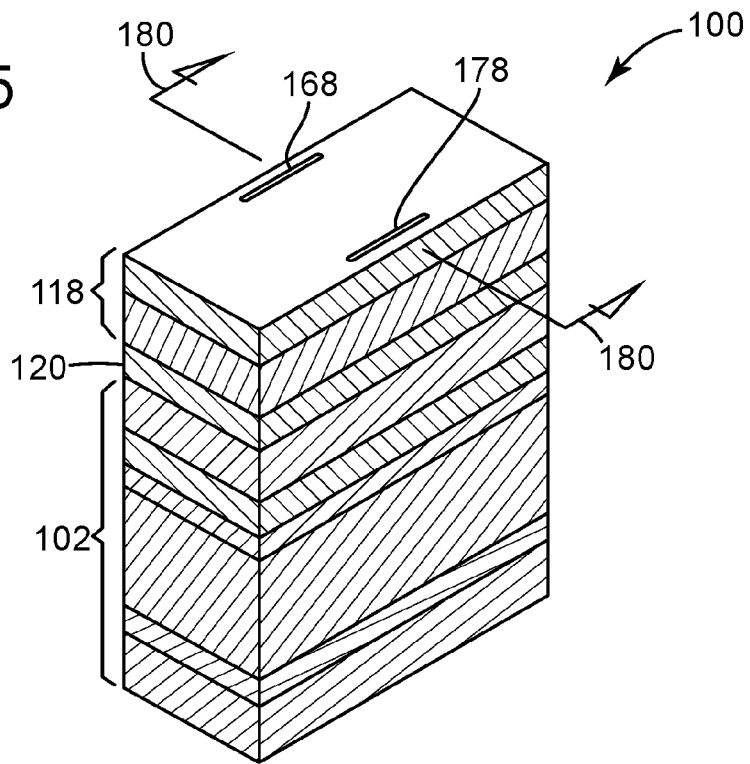
FIG. 15 is an exemplary embodiment of the structure of FIG. 14 having a second trench plug disposed therein in accordance with the present invention.
Figure 16:
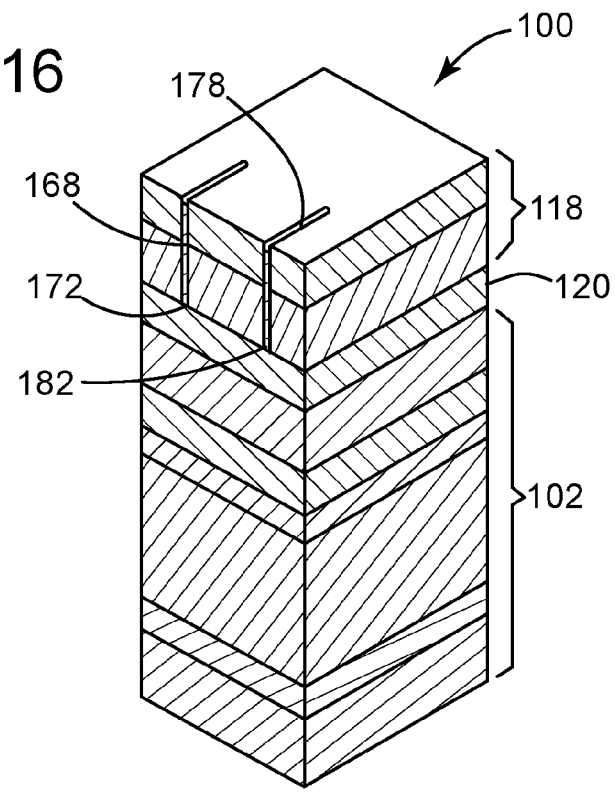
FIG. 16 is an exemplary embodiment of a cross-sectional view of FIG. 15 taken along the line 180 in accordance with the present invention.

Referring to FIG. 15, the film 176 is etched back to expose the first and second trench plug 168, 178. Referring to FIG. 16, a cross-sectional view of FIG. 15 taken along the line 180 is shown. As can be seen, the second trench plug penetrates the etch mask layer 118 and overlays a predetermined portion of the pattern layer 120 referred to herein as the beta block mask portion 182 of the pattern layer 120.

This completes the steps of module 138. However, it is important to note that the first and second trench plugs 168, 178 must have different material compositions in order to be able to selectively etch the plugs in various steps of the following modules. In this particular exemplary embodiment, SiN (a nitride) was chosen for the material of the first trench plug 168 and SiO2 (an oxide) was chosen for the material of the second trench plug 178. However, one skilled in the art would recognize that many other materials can be used. What is necessary is that the material for the first trench plug 168 be different enough from the material of the second trench plug 178 such that the two materials will have different etch rates for different etch processes. More preferably, the materials should be different enough such that the first trench plug 168 is readily etched and the second trench plug 178 is not etched at all by a first etch process, while the second trench plug 178 is readily etched and the first trench plug is not etched at all for a different second etch process.

In this manner, the first and second trench plugs can be selectively etched in the various steps of the remaining modules.

Module 140: Disposing Self-Aligned Spacers on Sidewalls of Mandrels to Define Beta and Gamma Regions. (FIGS. 17-24)

Figure 17:
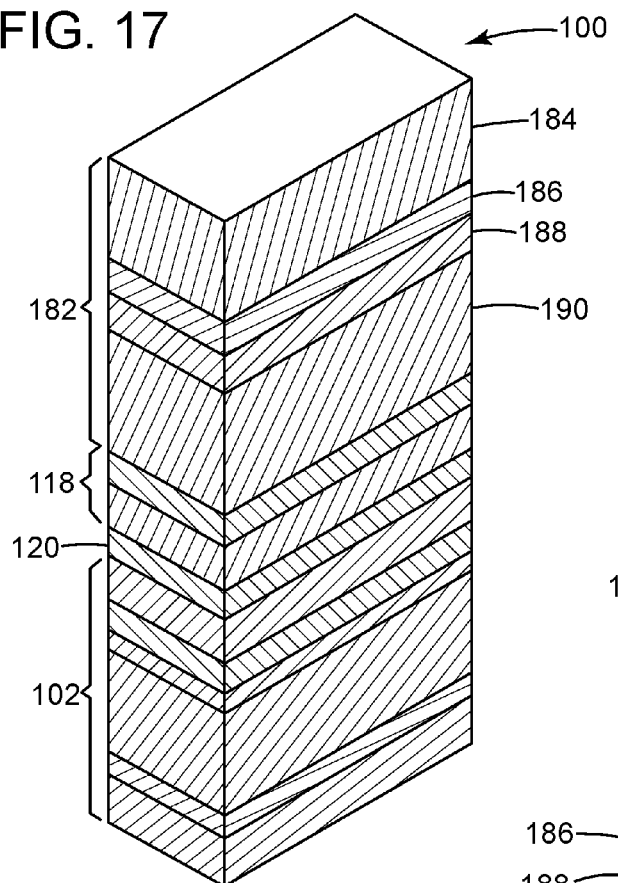
FIG. 17 is an exemplary embodiment of the structure of FIG. 16 having a lithographic stack disposed thereon in accordance with the present invention.

Referring to FIG. 17, after the first and second trench plugs 168, 178 have been disposed in the etch mask layer 118, another lithographic stack 182 is disposed over the etch mask layer 118. As in previous lithographic processes, the lithographic stack 182 includes a resist layer 184, a BARC layer 186, a dielectric layer 188 and a SOH layer 190.

Figure 18:
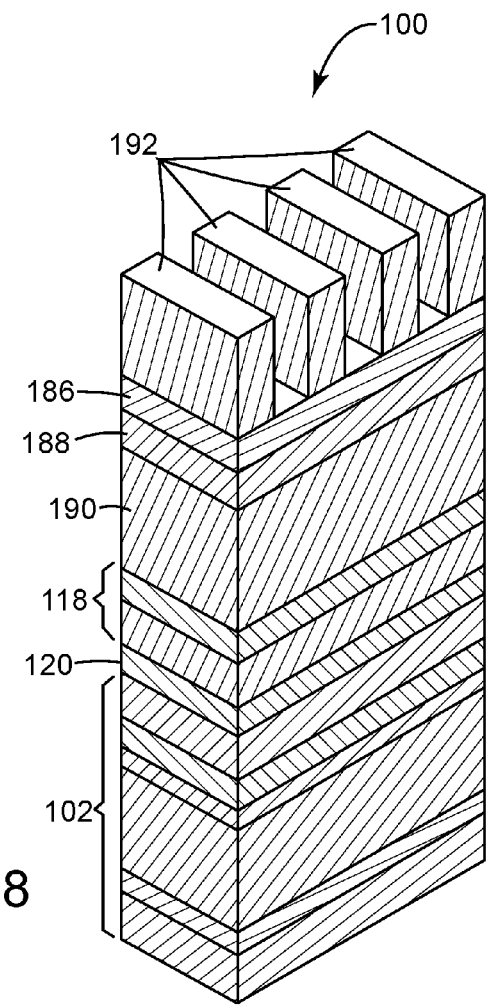
FIG. 18 is an exemplary embodiment of the structure of FIG. 17 having mandrels patterned thereon in accordance with the present invention.

Referring to FIG. 18, once the stack 182 is disposed over the etch mask layer 118, a parallel array of mandrels 192 is patterned into the resist layer 184. Note that in this exemplary embodiment, the pitch (i.e., the center to center distance between repetitive features of an integrated circuit) is 80 nm.

Figure 19:
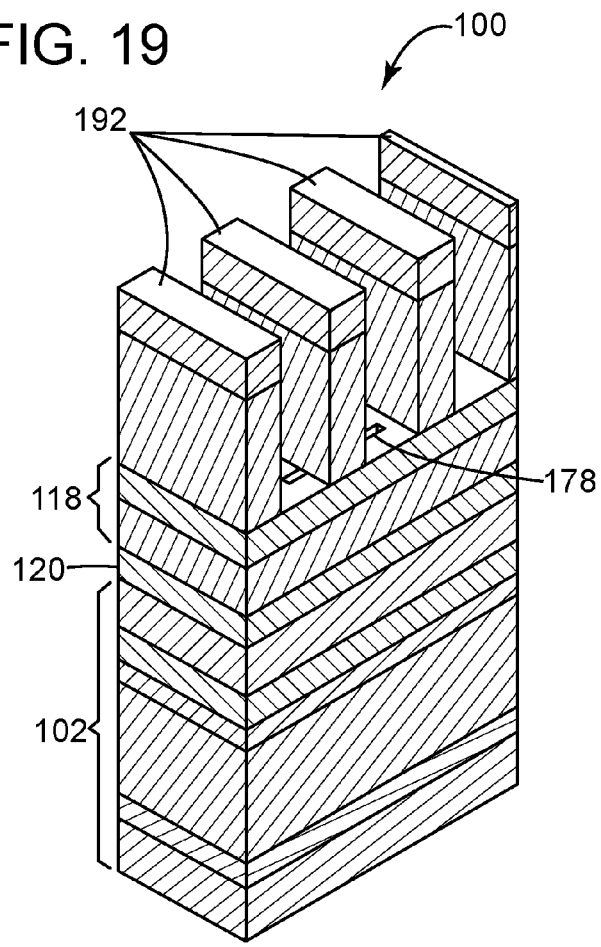
FIG. 19 is an exemplary embodiment of the structure of FIG. 18 having mandrels etched and thinned such that they extend down to the etch mask layer in accordance with the present invention.

Referring to FIG. 19, the mandrels 192 are then etched and trimmed, by a variety of well-known processes, to reduce the width of the mandrels to substantially 20 nm and extend the mandrels down to the etch mask layer 118. Note that even though the width of the mandrels 192 has been reduced, the pitch of 80 nm has not changed.

Figure 20:
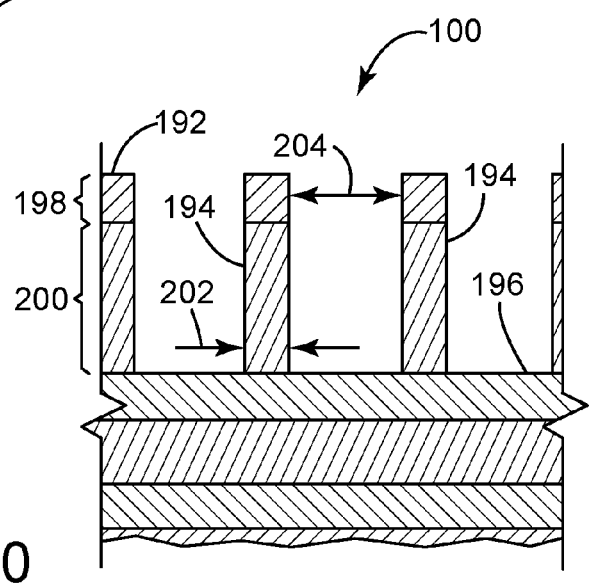
FIG. 20 is an exemplary embodiment of a side view of FIG. 19 in accordance with the present invention.

Referring to FIG. 20, a close-up side view of FIG. 19 shows the thinned mandrels 192. The mandrels 192 have sidewalls 194 extending normally (i.e., perpendicularly) upwards from an etch mask surface 196 of the etch mask layer 118. The distal upper portion 198 of mandrel 192 is composed of the remaining dielectric layer 188 of stack 182. However, the bulk of the mandrel 192 is the lower portion 200, which is composed of the remaining SOH layer 190 of stack 182. The lateral mandrel width (indicated by mandrel width arrow 202) is substantially 20 nm and the distance between sidewalls (indicated by sidewall distance arrow 204) is substantially 60 nm for a total pitch of 80 nm. However, one skilled in the art would recognize that the mandrel width and the distance between mandrel sidewalls can be a variety of ranges for this invention to be applicable. For example, an applicable range for the mandrel width could be 30 nm or less. Additionally, an applicable range for the distance between mandrels could be 100 nm or less.

Referring to FIG. 21, an oxide thin film 206, such as SiO2 (in this embodiment the film 206 is composed of the same material as the first trench plug 168) is conformally coated over the mandrels 192 and etch mask surface 196. The film 206 can be applied by a deposition process, such as an atomic layer deposition (ALD) process, which can precisely control the film thickness. In this embodiment, the film thickness is controlled to substantially 20 nm.

Referring to FIG. 22, the film 206 is anisotropically etched, such as by a RIE process, to expose a portion of the etch mask surface 196 and to expose the upper portion 200 of the mandrels 192. Most importantly however, the anisotropic etch forms an array of self-aligned spacers 208 disposed on the sidewalls 194 of the mandrels 192. The spacers 208 have a spacer width (indicated by spacer width arrows 210) which is substantially equal to the width of thin film 206, which in this case was controlled to be substantially 20 nm. However, one skilled in the art would recognize that the spacer width 210 can be controlled to a variety of ranges for this invention to be applicable. For example, an applicable range for the spacer width could be 30 nm or less.

The spacers also have a spacer height which is going to be less than or equal to the mandrel height due to the anisotropic etch process. The mandrels 192 and self-aligned spacers 208 define alternating beta regions 212 and gamma regions 214 which extend normally (perpendicularly) through dielectric layer 102 and through the entire structure 100.

Referring to FIGS. 23 and 24, close up side and top views, respectively, of FIG. 22 are shown. The mandrels 192 define beta regions 212a and 212b. The beta regions 212a and 212b each have a width equal to the mandrel width 202. As best seen in FIG. 23, the beta regions 212a, 212b extend normally through the dielectric layer 102. The beta region 212b also extends through a portion 216 of the second trench plug 178, which is disposed in the etch mask layer 118 and overlays the beta block mask portion 134 of the pattern layer 120. Although not shown in FIGS. 23 and 24, the beta region also extends through the beta block mask portion 134.

Additionally, the exposed portions of the etch mask surface 196, absent any spacers 208 and mandrels 192, define gamma regions 214a, 214b and 214c. The gamma regions 214a, 214b and 214c each have a width (indicated by arrow 217) equal to the distance (indicated by arrow 219) between the mandrels 192 minus twice the spacer width 210. As best seen in FIG. 23, the gamma regions 214a, 214b and 214c extend normally through the dielectric layer 102. The gamma region 214b also extends through a portion 218 of the first trench plug 168, which is disposed in the etch mask layer 118 and overlays the gamma block mask portion 132 of the pattern layer 120. Although not shown in FIGS. 23 and 24, the gamma region also extends through the gamma block mask portion 132.

This completes the steps of module 140. It is important to note that the relative positions and dimensions of mandrels 192, self-aligned spacers 208, non-self-aligned first trench plug 168 and non-self-aligned second trench plug 178 within structure 100 are critical to the formation of the pattern 126 and, therefore, to the formation of the electrical interconnection system of structure 100. However, due to the problems of lithographic misalignment at small technology class sizes such as 10 nm or less, the first trench plug 168 will spuriously over-extend into the beta region an unacceptable amount of times during mass production. Additionally during mass production, the second trench plug 178 will also spuriously over-extend into the gamma region an unacceptable amount of time. This over-extension is illustrated in FIG. 24, wherein a portion 220 of the first trench plug 168 over-extends into beta region 212a and a portion 222 of the second trench plug 178 over-extends into the gamma region 214b. The remaining modules will detail an exemplary embodiment of the steps to remove these portions 220 and 222, from the beta and gamma regions respectively, in accordance with the present invention.

Module 142: Repair of the Gamma Region. (FIGS. 25-28)

Figure 25:
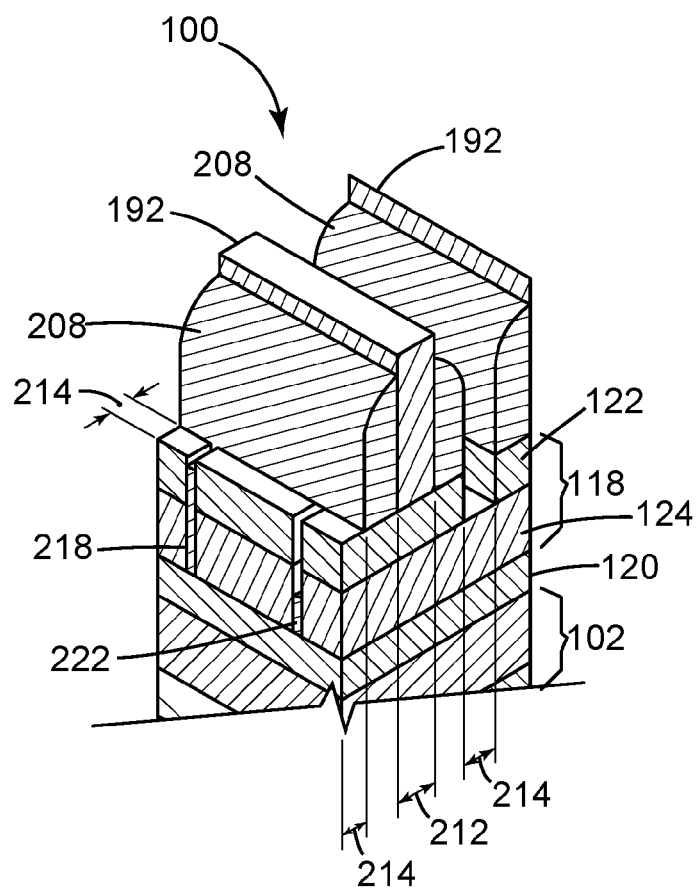
FIG. 25 is a cross-sectional perspective view of FIG. 24 taken along the line 224 of FIG. 24 in accordance with the present invention.

Referring to FIG. 25, a cross-sectional perspective view of FIG. 24 taken along the line 224, which cuts through gamma region 214b of FIG. 24, is shown. As can be seen, the first trench cut 168 and second trench cut 178 are exposed in the gamma region 214, while the first and second trench cuts 168, 178 are protected (covered) by the mandrels 192 in the beta region 212. That is, portion 218 of the first trench cut 168 and portion 222 of the second trench cut are exposed in the gamma region and can be selectively etched.

Figure 26:
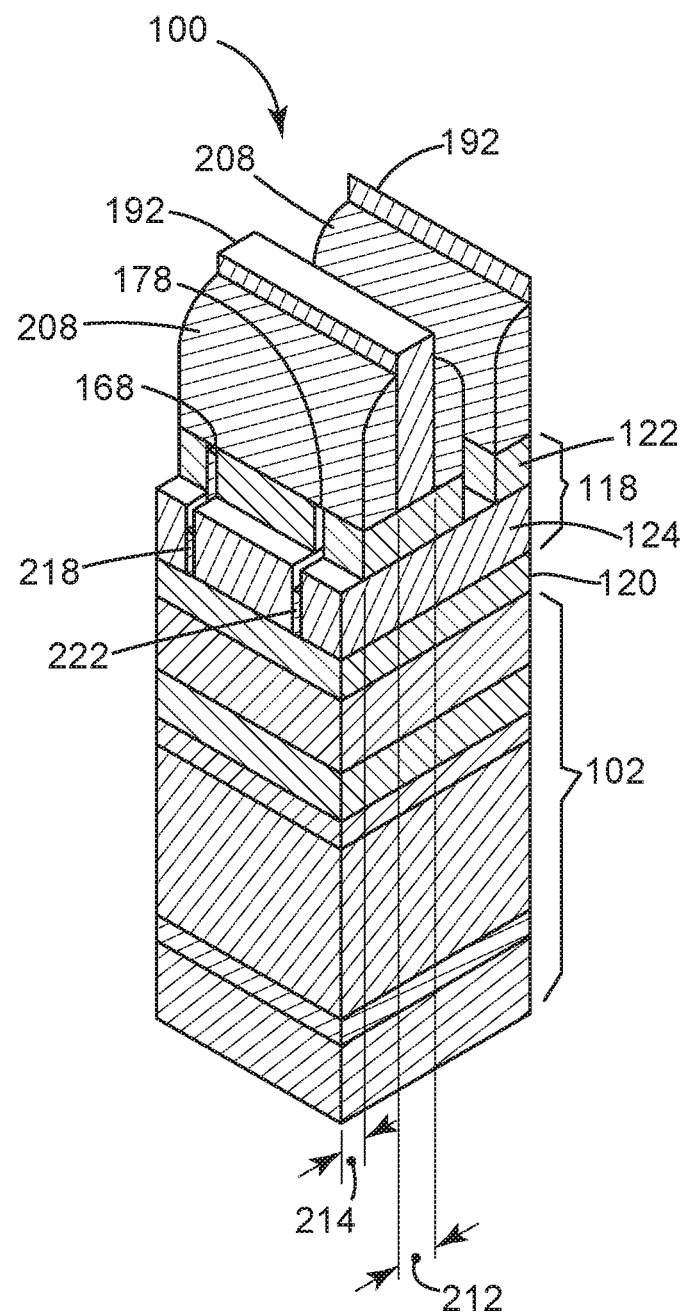
FIG. 26 is an exemplary embodiment of the structure of FIG. 25 after an anisotropic etch process is performed thereon in accordance with the present invention.
Figure 27:
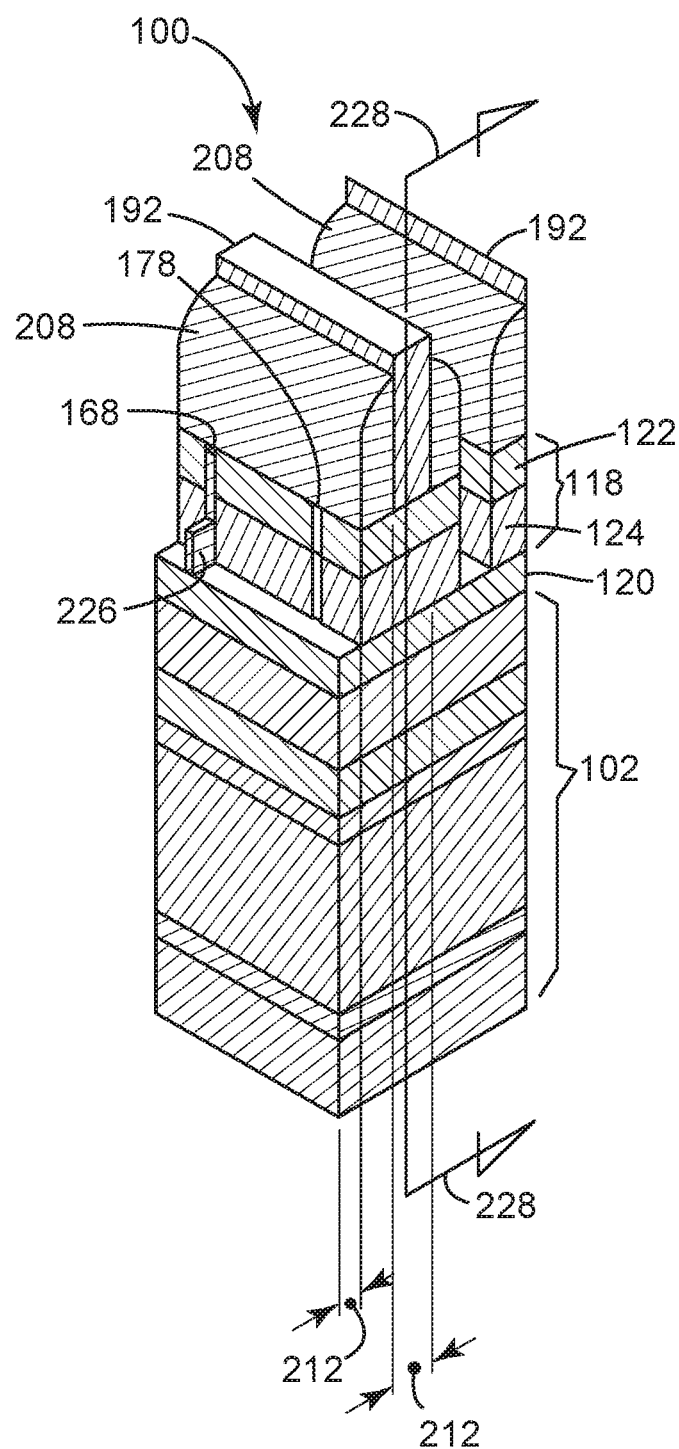
FIG. 27 is an exemplary embodiment of the structure of FIG. 26 after an anisotropic etch process is performed thereon in accordance with the present invention.
Figure 28:
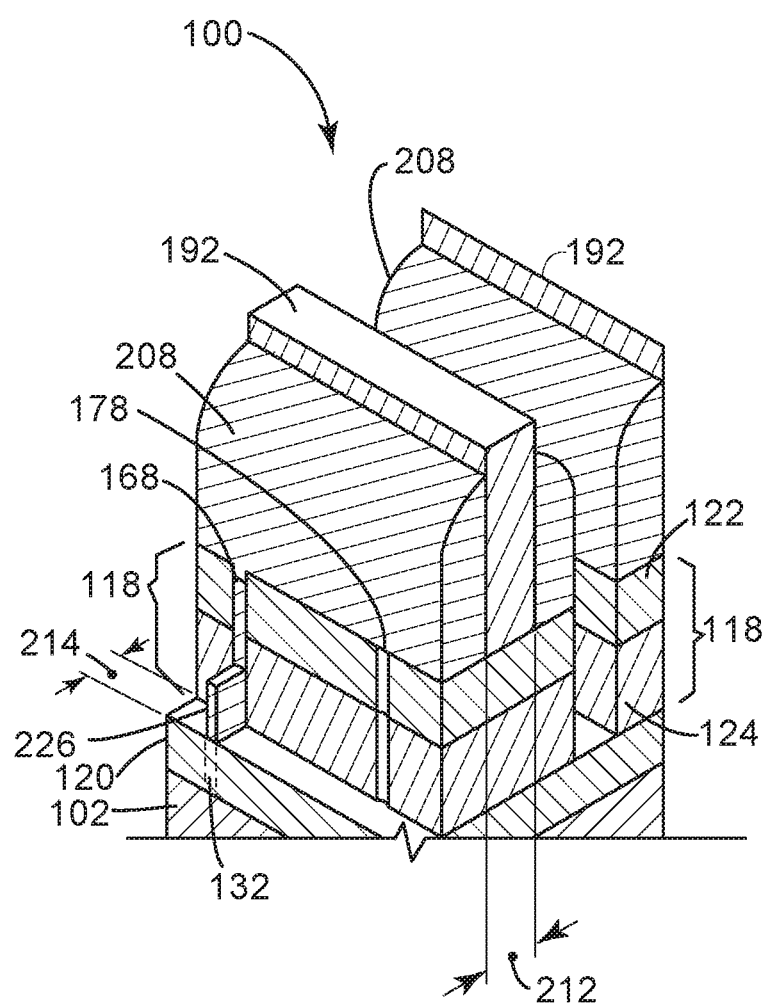
FIG. 28 is a close-up view of FIG. 27 in accordance with the present invention.

Referring to FIGS. 26, 27 and 28, a selective etching of any portions of the etch mask layer 118 and second trench plug 178 which extend into the gamma region 214 is performed to remove such portions from the gamma region 214. Additionally a selective partial etching of any portions of the first trench plug 168 which extends into the gamma region 214 is performed, to form a recessed first trench plug portion 226 overlaying the gamma block mask portion 132 of the pattern layer 120 in the gamma region 214.

More specifically, referring to FIG. 26, a first titanium nitride (TiN) reactive ion etch (RIE) is first performed to remove exposed portions of the TiN memo layer 122 (a first component of the etch mask layer 118) from the gamma region 214. Then referring to FIG. 27, a second combined spin-on hardmask (SOH) and silicon dioxide (SiO2) RIE etch is performed to remove the exposed portions of the SOH interposer layer 124 (a second component of the etch mask layer 118) and portion 222 of the SiO2 second trench plug 178 from the gamma region 214. By the same token, both spacers 208 and mandrels 192 are partially recessed since they are respectively composed of SiO2 and SOH, however their height was chosen initially so that they would not be fully etched away during this RIE operation.

The second RIE etch is selective to silicon nitride (SiN), for instance with a selectivity of 1:5 for SiN versus SiO2, SiN being what the first trench plug 168 is composed of in this embodiment. Therefore, the second etch will not completely remove the first trench plug 168 from the gamma region 214. Rather, the second etch will partially etch back portion 218 of the first trench plug 168 to form the recessed first trench plug portion 226 (best seen in FIG. 28) in the gamma region 214. The recessed first trench plug portion 226 overlays (and will later be used to protect) the gamma block mask portion 132.

This completes the steps of module 142. Note that there now exists in the gamma region 214 a desirable recessed first trench plug portion 226 and no second trench plug 178 portion. Essentially, the gamma region has been repaired of any spurious over-extensions of the second trench plug 178 into that region, while the beta region 212 has been left protected by the mandrels 192.

Module 144: Masking the Gamma Region and Exposing the Beta Region. (FIGS. 29-34)

Figure 29:
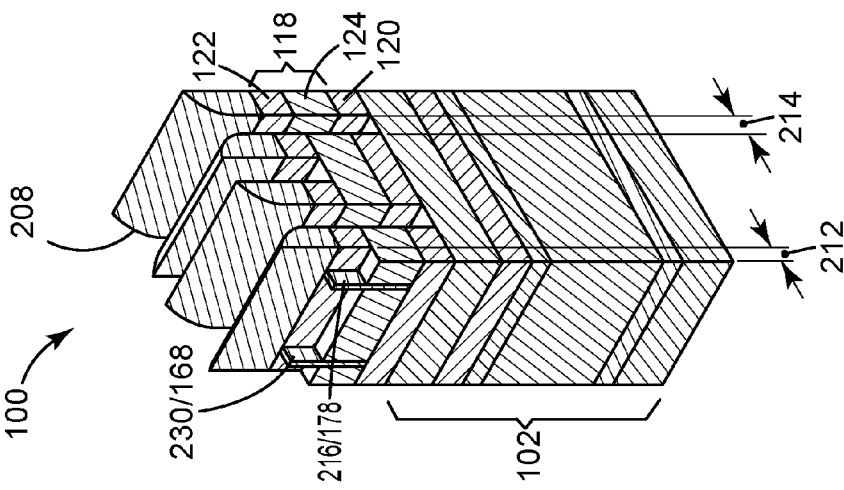
FIG. 29 is a cross-sectional view of FIG. 27 taken along the line 228 of FIG. 27 in accordance with the present invention.

Referring to FIG. 29, a cross-sectional perspective view of FIG. 27 taken along the line 228, which cuts through beta region 212 of FIG. 27, is shown. As can be seen, any portions of the first and second trench plugs 168 and 178 in the beta regions 212 have been protected from any previous etching process by mandrels 192. Further, the gamma region 214 (including the recessed first trench plug portion 226 in the gamma region 214, best seen in FIG. 27) is fully exposed. Therefore, the gamma region 214, must now be protected and the beta region 212 exposed for selective etching and repair in the beta region 212.

Figure 30:
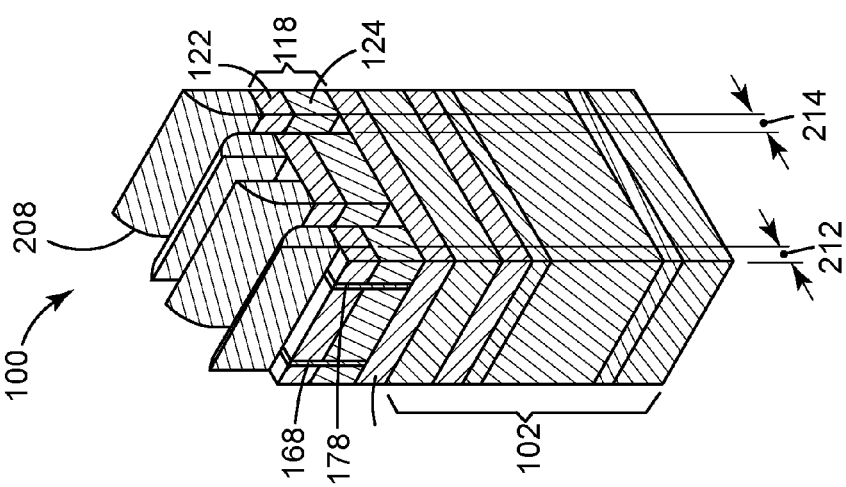
FIG. 30 is an exemplary embodiment of the structure of FIG. 29 after an anisotropic etch process is performed thereon in accordance with the present invention.
Figure 31:
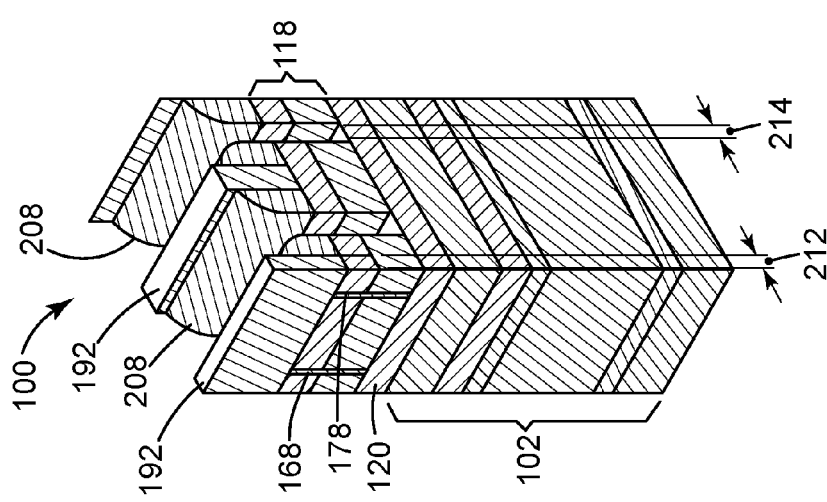
FIG. 31 is an exemplary embodiment of the structure of FIG. 30 after an anisotropic etch process is performed thereon in accordance with the present invention.
Figure 32:
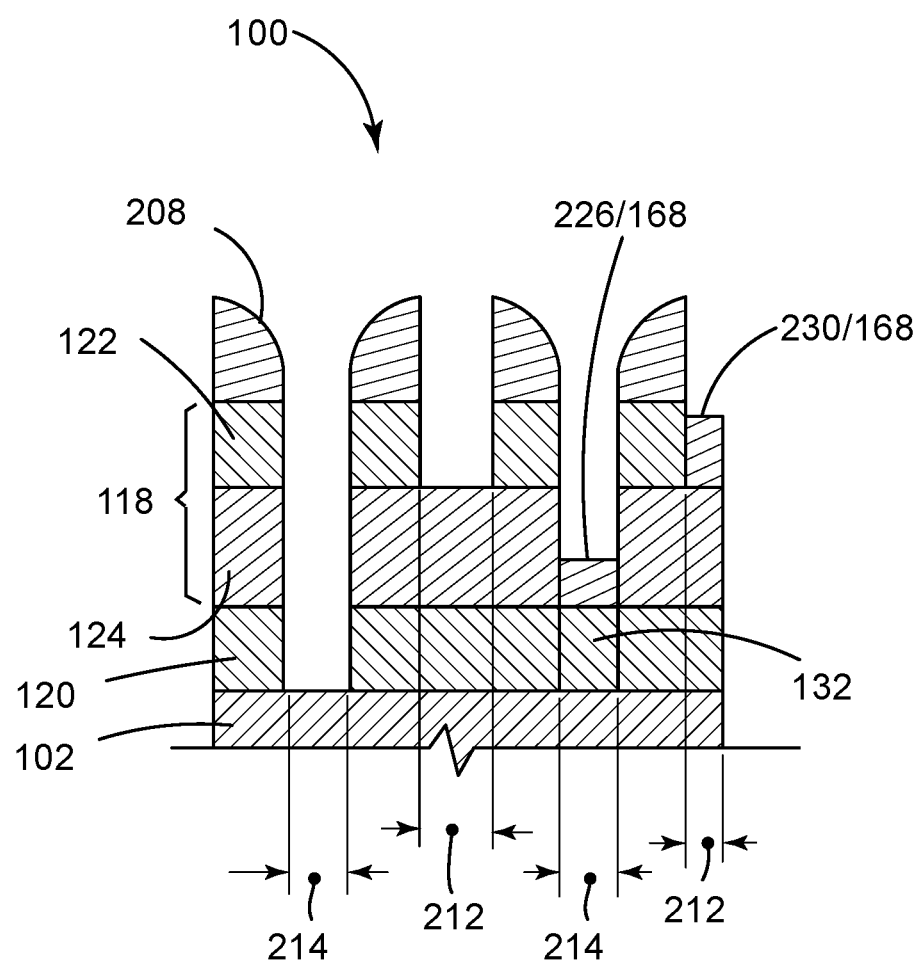
FIG. 32 is a close-up side view of FIG. 31 in accordance with the present invention.

Referring to FIGS. 30, 31 and 32, a selective etching of the mandrels 192 is performed to remove the mandrels from the beta region 212. The etching also exposes any portion of the first trench plug 168 extending into the beta region 212 to form an unrecessed first trench plug portion 230 within the beta region 212. The etching also preserves the second trench plug portion 216 (of the second trench plug 178) within the beta region.

Additionally, a selective etching of any exposed portions of the pattern layer 120 which extend into the gamma region 214 is performed to remove all such exposed portions of the pattern layer 120 from the gamma region 214 and to preserve the recessed first trench plug portion 226 within the gamma region.

More specifically, referring to FIG. 30, an SOH anisotropic etch, such as a RIE etch, is performed on structure 100 to remove the mandrels 192 and expose the tops of the first and second trench plugs 168, 178 in the beta regions 212. The SOH RIE etch is selective so it does not affect the first or second trench plugs 168, 178.

Referring to FIG. 31, a TiN RIE etch is next performed on structure 100. Since the memo layer 122 and pattern layer 120 are each composed of TiN in this embodiment, then the RIE etch removes any exposed TiN portions of the memo layer 122 in the beta regions 212 and any exposed portions of the pattern layer 120 in the gamma region 214. Since the TiN RIE etch does not affect the SiO2 material of the second trench plug 178 or the SiN material of the first trench plug 168, both the first and second trench plugs are preserved during this TiN etching process in both beta and gamma regions. However, the TiN RIE etch does serve to further expose and form the unrecessed first trench plug portion 230 within beta region 212.

Referring to FIG. 32, a left side view of FIG. 31 is presented. From this view, it can be seen that the TiN RIE etching process has not only exposed the unrecessed first trench plug portion 230 of the beta trench plug 168 in the beta region 212, it has preserved the recessed first trench plug portion 226 of the beta trench plug 168 in the gamma region 214. Additionally, it can be seen that the recessed first trench plug portion 226 desirably overlays and protects the gamma block mask portion 132 of the pattern layer 120 in the gamma region 214.

Figure 33:
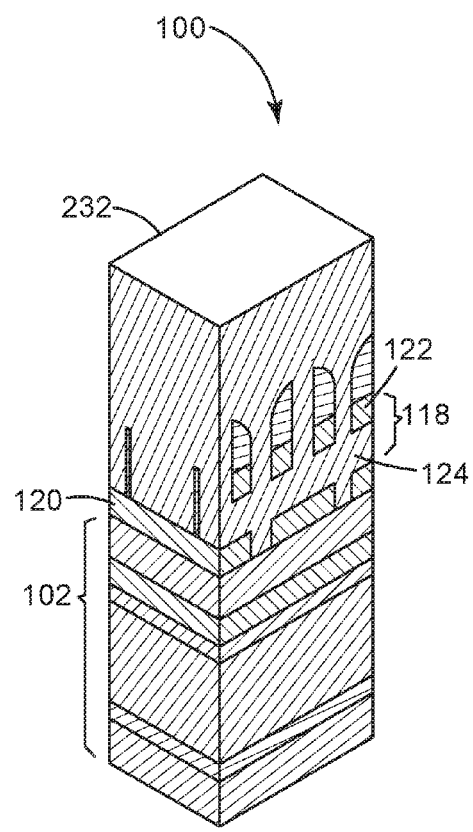
FIG. 33 is an exemplary embodiment of the structure of FIG. 31 having a second mask layer disposed thereon in accordance with the present invention.

Referring to FIG. 33, next a second mask layer 232 is disposed onto structure 100 specifically to cover the recessed first trench plug portion 226 within the gamma region 214 and the unrecessed first trench plug portion 230 within the beta region 212. More practically however, the second mask layer 232 is disposed to cover the entire structure 100. The second mask layer 232 can be any appropriate organic material or resist. In this embodiment, it is another SOH of the same composition as the interposer layer 124 (which composes the bottom layer of the dual-layer etch mask layer 118). Accordingly, in this exemplary embodiment, the second mask layer 232 and the interposer layer 124 function as one indistinguishable layer composed of one material.

Referring to FIG. 34, next a controlled etch back of the second mask layer 232 is performed to expose the unrecessed first trench plug portion 230 within the beta region 212, but not the recessed first trench plug portion 226 within the gamma region 214. More specifically, for this embodiment, an SOH RIE etch process is used to anisotropically etch/recess the second mask layer 232 and expose the unrecessed first trench plug portion 230. Note that the second trench plug 178 in the beta region 212 is also exposed during this process.

This completes the steps of module 144. Note that the gamma region 214, including the recessed first trench plug portion 226 is completely masked over and protected, while the unrecessed first trench plug portion 230 is exposed and can now be removed in subsequent steps.

Module 146: Repair of Beta Region. (FIGS. 35-36)

Referring to FIG. 35, both beta and gamma cross-sections of FIG. 34 are shown as a pair. More specifically, FIG. 34 is a perspective view of a beta cross-section of structure 100 and is reproduced as the lower portion of FIG. 35. The upper portion of FIG. 35 is a gamma cross-sectional perspective view of FIG. 34 taken along the line 234 of FIG. 34. As can be seen in the beta regions, the unrecessed first trench plug portion 230 and second trench plug 178 are exposed.

In the gamma regions 214, the recessed first trench plug portion 226, which overlays the gamma block mask portion 132, is completely covered by the second mask layer 232. Additionally, there are no spurious portions of the second trench plug 178 in the gamma region.

Referring to FIG. 36, both beta and gamma cross-sections of FIG. 35, after going through the next selective etch process, are shown as a pair. The etch process selectively etches the exposed unrecessed first trench plug portion 230 to remove the unrecessed first trench plug portion 230 from the beta region 212 and to preserve the second trench plug portion 178 within the beta region 212. More specifically, for this embodiment, a selective nitride RIE etch is performed to remove just the SiN first trench plug portion 230.

This completes the steps for module 146. Note that all spurious portions of the first trench plug 168 have now been removed from the beta region and all spurious portions of the second trench plug 178 have now been removed from the gamma region. The structure 100 is now ready to be selectively etched to form the pattern 126.

Module 148 Formation of Pattern (FIGS. 37-39)

Referring to FIG. 37, both beta and gamma cross-sections of FIG. 36, after going through the next selective etch process, are shown as a pair. The etch process selectively anisotropically etches the remainder of the etch mask layer 118 and second mask layer 232 to remove such layers from both the beta and gamma regions 212, 214 and to preserve a portion of the etch mask layer 118 disposed under the spacers 208. More specifically, for this embodiment, a SOH RIE etch is performed to remove all exposed portions of the etch mask layer 118 and second mask layer 232.

Referring to FIG. 38, both beta and gamma cross-sections of FIG. 37, after going through the next selective etch process, are shown as a pair. The selective etch process, for this embodiment, is an anisotropic SiO2 RIE partial etch designed to remove the SiO2 spacers 208. As a consequence it also recesses the SiO2 second trench plug 178 in the beta region to provide a recessed second trench plug portion 236.

It is important to note, that in order to preserve a recessed portion of the SiO2 second trench plug 178 in the beta region 212 while fully removing the SiO2 spacers 208, the height of the second trench plug 178 must be greater than the height of the spacers 208. For this to happen, the height of the etch mask layer 118 must be predetermined to be greater than the height of the mandrels 192. This is because, the spacer height cannot be greater than the mandrel height (as discussed earlier herein), and the second trench plug 178 fully fills the entire height of the etch mask layer due to the deposition process which disposed the second trench plug 178 into the etch mask layer 118. Under these conditions, the results (as can be seen in FIG. 38) of the etching process are the following: the spacers 208 are removed to expose the memo layer 122, the portion of the second trench plug 178 preserved in the beta region 212 is partially etched back to provide a recessed second trench plug portion 236 extending into the beta region 212, and the recessed first trench plug portion 226 extending into the gamma region 214 is preserved.

Referring to FIG. 39, finally the structure 100 of FIG. 38 is anisotropically etched such that the exposed portions of the memo layer 122 and pattern layer 120 are removed to form the pattern 126 in the pattern layer 120. More specifically, the structure 100 of FIG. 38 is subjected, in this embodiment, to a TiN RIE etch, since both the memo layer and pattern layer are composed of TiN.

Not affected by the RIE etch process are those portions of the pattern layer 120, which are disposed under the remainder of the interposer layer 124. Additionally, the gamma block mask portion 132 is protected by the recessed first trench plug portion 226, and the beta block mask portion 134 is protected by the recessed second trench plug portion 236. The combination of the preserved portions of the pattern layer 120 forms the pattern 126.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
providing a structure, the structure having an etch mask layer disposed over a pattern layer and the pattern layer disposed over a dielectric layer;
disposing a first and a second trench plug in the etch mask layer, the first and second trench plugs having different material compositions;
utilizing a self-aligned double patterning process to form an array of self-aligned spacers disposed on sidewalls of mandrels, the spacers and mandrels defining alternating beta and gamma regions extending normally through the dielectric layer, a gamma region extending through a portion of the first trench plug, a beta region extending through a portion of the second trench plug;
selectively etching the structure to remove any portion of the first trench plug from the beta regions and any portion of the second trench plug from the gamma regions;
selectively etching the structure to form a pattern in the pattern layer, the pattern including:
a gamma block mask portion disposed in a gamma region, wherein a portion of the first trench plug overlays the gamma block mask portion, and
a beta block mask portion disposed in a beta region, wherein a portion of the second trench plug overlays the beta block mask portion.

2. The method of claim 1 wherein utilizing lithographic processes comprises:
patterning the etch mask layer to form a first trench and a second trench within the etch mask layer, the first trench overlaying a gamma block mask portion of the pattern layer and the second trench overlaying a beta block mask portion of the pattern layer; and
disposing a first trench plug in the first trench and a second trench plug in the second trench, the first and second trench plugs having different material compositions.

3. The method of claim 1 wherein utilizing a self-aligned double patterning process comprises:
disposing a lithographic stack of layers over the etch mask layer;
patterning the lithographic stack to form an array of mandrels having sidewalls extending normally upwards from an etch mask surface of the etch mask layer, the mandrels having a mandrel width and a mandrel height;
conformal coating the mandrels and etch mask surface with a thin film; and
anisotropically etching the film to expose a portion of the etch mask surface and to form an array of self-aligned spacers disposed on the sidewalls of the mandrels, the spacers having a spacer width and spacer height less than the mandrel height.

4. The method of claim 3 wherein:
the mandrels define a beta region having a width equal to the mandrel width and extending normally through the dielectric layer, the beta region also extending through a portion of the second trench plug and the beta block mask portion; and the exposed portion of the etch mask surface, absent any spacers and mandrels, defines a gamma region having a width equal to the distance between the mandrels minus twice the spacer width, the gamma region extending normally through the dielectric layer, the gamma region also extending through a portion of the first trench plug and the gamma block mask portion.

5. The method of claim 1 wherein:

the pattern defines locations of gamma interconnect lines disposed in the gamma region of the dielectric layer and beta interconnect lines disposed in the beta region of the dielectric layer;

the gamma block mask portion of the pattern defines locations of gamma blocks in the dielectric layer, which block electrical continuity of gamma interconnect lines, the gamma blocks extending across the entire width of the gamma region but not extending into the beta region; and the beta block mask portion of the pattern defines location of beta blocks in the dielectric layer, which block electrical continuity of beta interconnect lines; the beta blocks extending across the entire width of the beta region but not extending into the gamma region.

6. A method comprising:

disposing a pattern layer over a dielectric layer;

disposing an etch mask layer over the pattern layer;

patterning the etch mask layer to form a first trench and a second trench within the etch mask layer;

disposing a first trench plug in the first trench and a second trench plug in the second trench, the first and second trench plugs having different material compositions;

disposing a lithographic stack of layers over the etch mask layer;

patterning the lithographic stack to form an array of mandrels having sidewalls extending normally upwards from an etch mask surface of the etch mask layer, the mandrels having a mandrel width and a mandrel height;

conformal coating the mandrels and etch mask surface with a thin film; and anisotropically etching the film to expose a portion of the etch mask surface and to form an array of self-aligned spacers disposed on the sidewalls of the mandrels, the spacers having a spacer width and spacer height less than the mandrel height; and selectively etching the etch mask layer, first trench plug, second trench plug and pattern layer to form a pattern in the pattern layer, the pattern including:

a gamma block mask portion, wherein a portion of the first trench plug overlays the gamma block mask portion, and a beta block mask portion, wherein a portion of the second trench plug overlays the beta block mask portion;

wherein the pattern defines locations of interconnect lines disposed in the dielectric layer and wherein the gamma and beta block mask portions define locations of continuity blocks in the dielectric layer.

7. The method of claim 6 wherein:

the mandrels define a beta region having a width equal to the mandrel width and extending normally through the dielectric layer, the beta region also extending through a portion of the second trench plug and the beta block mask portion; and the exposed portion of the etch mask surface, absent any spacers and mandrels, defines a gamma region having a width equal to the distance between the mandrels minus twice the spacer width, the gamma region extending normally through the dielectric layer, the gamma region also extending through a portion of the first trench plug and the gamma block mask portion.

8. The method of claim 7 comprising:

selectively etching any portions of the etch mask layer and second trench plug which extend into the gamma region, to remove such portions from the gamma region; and selectively partially etching any portions of the first trench plug which extends into the gamma region, to form a recessed first trench plug portion overlaying the gamma block mask portion of the pattern layer in the gamma region.

9. The method of claim 8 comprising:

selectively etching the mandrels to remove the mandrels from the beta region and to expose any portion of the first trench plug extending into the beta region to form an unrecessed first trench plug portion within the beta region and to preserve the second trench plug portion within the beta region; and selectively etching any exposed portions of the pattern layer which extend into the gamma region to remove all such exposed portions from the gamma region and to preserve the recessed first trench plug portion within the gamma region.

10. The method of claim 9 comprising:

disposing a second mask layer to cover the recessed first trench plug portion within the gamma region and the unrecessed first trench plug portion within the beta region;

etching back the second mask layer to expose the unrecessed first trench plug portion within the beta region, but not the recessed first trench plug portion within the gamma region; and selectively etching the exposed unrecessed first trench plug portion to remove the unrecessed first trench plug portion from the beta region and to preserve the second trench plug portion within the beta region.

11. The method of claim 10 comprising:

selectively anisotropically etching the etch mask layer and second mask layer to remove such layers from both the beta and gamma regions and to preserve a portion of the etch mask layer disposed under the spacers.

12. The method of claim 11 wherein the etch mask layer includes a memo layer disposed on an interposer layer, and wherein the height of the etch mask layer is greater than the mandrel height, the method comprising:

selectively anisotropically etching both the spacers and the portion of the second trench plug preserved in the beta region, wherein the etching:

removes the spacers to expose the memo layer, partially etches the portion of the second trench plug preserved in the beta region to provide a recessed second trench plug portion extending into the beta region, and preserves the recessed first trench plug portion extending into the gamma region.

13. The method of claim 12 comprising:

anisotropically etching exposed portions of the memo layer and pattern layer to remove such exposed portions and form the pattern in the pattern layer.

14. The method of claim 6 wherein:

the pattern defines locations of gamma interconnect lines disposed in the gamma region and beta interconnect lines disposed in the beta region of the dielectric;

the gamma block mask portion of the pattern defines locations of gamma blocks in the dielectric layer, which block electrical continuity of gamma interconnect lines, the gamma blocks extending across the entire width of the gamma region but not extending into the beta region; and the beta block mask portion of the pattern defines location of beta blocks in the dielectric layer, which block electrical continuity of beta interconnect lines; and beta blocks extending across the entire width of the beta region but not extending into the gamma region.

15. The method of claim 6 wherein selectively etching comprises selectively anisotropic etching the etch mask layer, first trench plug, second trench plug and pattern layer to form the pattern in the pattern layer.

16. The method of claim 15 wherein the anisotropic etching is a reactive ion etching.

17. The method of claim 6 wherein the first trench plug is composed of silicon nitride and the second trench plug is composed of silicon dioxide.

18. The method of claim 6 comprising:

the spacers composed of silicon oxide; and the mandrels composed of a spin on hard mask of amorphous carbon or of any appropriate organic/resist type of material.

* * * * *